US012604511B2

(12) United States Patent
Jeon et al.

(10) Patent No.: US 12,604,511 B2
(45) Date of Patent: Apr. 14, 2026

(54) SEMICONDUCTOR DEVICE WITH ACTIVE PORTIONS OF VARIED WIDTHS INSIDE ACTIVE PATTERN

(71) Applicant: SAMSUNG ELECTRONICS CO., LTD., Suwon-si (KR)

(72) Inventors: Joongwon Jeon, Suwon-si (KR); Kiheung Park, Suwon-si (KR); Jae Hyun Kang, Suwon-si (KR); Byung-Moo Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 406 days.

(21) Appl. No.: 18/501,354

(22) Filed: Nov. 3, 2023

(65) Prior Publication Data

US 2024/0387654 A1     Nov. 21, 2024

(30) Foreign Application Priority Data

May 17, 2023     (KR) ........................ 10-2023-0063550

(51) Int. Cl.
H10D 64/23          (2025.01)
H10D 64/01          (2025.01)

(52) U.S. Cl.
CPC ......... *H10D 64/258* (2025.01); *H10D 64/017* (2025.01)

(58) Field of Classification Search
CPC .. H10D 64/258; H10D 64/017; H10D 30/797; H10D 62/121; H10D 84/853; H10D 30/62; H10D 30/6757; H10D 62/113; H10D 62/151
See application file for complete search history.

(56) References Cited

U.S. PATENT DOCUMENTS

| | | | |
|---|---|---|---|
| 10,700,064 B1 | 6/2020 | Zhang et al. | |
| 11,075,195 B2 | 7/2021 | Wang et al. | |
| 11,569,231 B2 | 1/2023 | Snyder et al. | |
| 2020/0220017 A1* | 7/2020 | Rachmady | H10D 30/024 |
| 2022/0237358 A1 | 7/2022 | Yang et al. | |
| 2022/0310586 A1 | 9/2022 | Jung et al. | |
| 2022/0344463 A1 | 10/2022 | Jung et al. | |
| 2023/0268412 A1* | 8/2023 | Jung | H10D 84/834 |
| | | | 257/288 |

FOREIGN PATENT DOCUMENTS

KR     10-2024-0048862     4/2024

* cited by examiner

*Primary Examiner* — John P. Dulka
(74) *Attorney, Agent, or Firm* — Fish & Richardson P.C.

(57)          ABSTRACT

The present disclosure relates to semiconductor devices. One example semiconductor device comprises a substrate that includes a first active pattern, a first source/drain pattern, a second source/drain pattern, and a third source/drain pattern on the first active patter, a first separation structure between the first source/drain pattern and the second source/drain pattern, and a second separation structure between the second source/drain pattern and the third source/drain pattern. The first active pattern includes a first active portion that overlaps the first source/drain pattern, a second active portion that overlaps the second source/drain pattern, a third active portion that overlaps the third source/drain pattern, a first intervening portion between the first active portion and the second active portion, and a second intervening portion between the second active portion and the third active portion.

20 Claims, 17 Drawing Sheets

CTa

SEMICONDUCTOR DEVICE WITH ACTIVE PORTIONS OF VARIED WIDTHS INSIDE ACTIVE PATTERN

CROSS-REFERENCE TO RELATED APPLICATION

This application claims priority under 35 U.S.C § 119 to Korean Patent Application No. 10-2023-0063550, filed on May 17, 2023, in the Korean Intellectual Property Office, the disclosure of which is hereby incorporated by reference in its entirety.

BACKGROUND

A semiconductor device includes an integrated circuit consisting of metal oxide semiconductor field effect transistors (MOSFETs). As size and design rule of the semiconductor device are gradually decreased, sizes of the MOSFETs are also increasingly scaled down. The scale down of MOSFETs may deteriorate operating characteristics of the semiconductor device. Accordingly, research has been conducted to manufacture the semiconductor device having excellent performances while overcoming limitations due to integration of the semiconductor device.

SUMMARY

The present disclosure relates to semiconductor devices, including a semiconductor device with increased reliability and improved electrical properties, and methods of fabricating the same.

In some implementations, a semiconductor device may comprise: a substrate that includes a first active pattern; a first source/drain pattern, a second source/drain pattern, and a third source/drain pattern on the first active pattern; a first separation structure between the first source/drain pattern and the second source/drain pattern; and a second separation structure between the second source/drain pattern and the third source/drain pattern. The first active pattern may include: a first active portion that overlaps the first source/drain pattern; a second active portion that overlaps the second source/drain pattern; a third active portion that overlaps the third source/drain pattern; a first intervening portion between the first active portion and the second active portion; and a second intervening portion between the second active portion and the third active portion. The first intervening portion may overlap the first separation structure. The second intervening portion may overlap the second separation structure. A first width of the first active portion may be different from a second width of the second active portion. A third width of the third active portion may be different from the second width. A first central line of the first active pattern may be defined. Each of the first, second, and third active portions may have a first sidewall and a second sidewall that are disposed symmetrically about the first central line.

In some implementations, a semiconductor device may comprise: a substrate that includes a first active pattern and a second active pattern; and a first separation structure and a second separation structure on the first active pattern and the second active pattern. The first active pattern may include: a first intervening portion that overlaps the first separation structure; a second intervening portion that overlaps the second separation structure; a first active portion connected to the first intervening portion; a second active portion connected to the first intervening portion and the second intervening portion; and a third active portion connected to the second intervening portion. A first width of the first active portion may be different from a second width of the second active portion. A third width of the third active portion may be different from the second width. Each of the first, second, and third active portions may have a first sidewall that faces the second active pattern. A first distance between the first sidewall of the first active portion and the first sidewall of the second active portion may be the same as a second distance between the first sidewall of the second active portion and the first sidewall of the third active portion.

In some implementations, a semiconductor device may comprise: a substrate that includes a first active pattern; a first source/drain pattern, a second source/drain pattern, a third source/drain pattern, and a dummy source/drain pattern on the first active pattern; a first separation structure between the first source/drain pattern and the second source/drain pattern; a second separation structure between the second source/drain pattern and the third source/drain pattern; and a third separation structure between the third source/drain pattern and the dummy source/drain pattern. The first active pattern may include: a first active portion that overlaps the first source/drain pattern; a second active portion that overlaps the second source/drain pattern; a third active portion that overlaps the third source/drain pattern; a dummy portion that overlaps the dummy source/drain pattern; a first intervening portion between the first active portion and the second active portion; a second intervening portion between the second active portion and the third active portion; and a third intervening portion between the third active portion and the dummy portion. The first intervening portion may overlap the first separation structure. The second intervening portion may overlap the second separation structure. The third intervening portion may overlap the third separation structure. A first central line of the first active pattern may be defined. Each of the first, second, and third active portions and the dummy portion may have a first sidewall and a second sidewall that are disposed symmetrically about the first central line. A first distance between the first sidewall of the first active portion and the first sidewall of the second active portion, and a second distance between the first sidewall of the second active portion and the first sidewall of the third active portion may be less than a third distance between the first sidewall of the third active portion and the first sidewall of the dummy portion.

BRIEF DESCRIPTION OF THE DRAWINGS

FIG. 4A illustrates an example plan view showing a semiconductor device.

FIG. 5 illustrates an example plan view showing active patterns of a semiconductor pattern.

FIG. 8 illustrates another example plan view showing active patterns of a semiconductor device.

DETAILED DESCRIPTION

Figure 1:
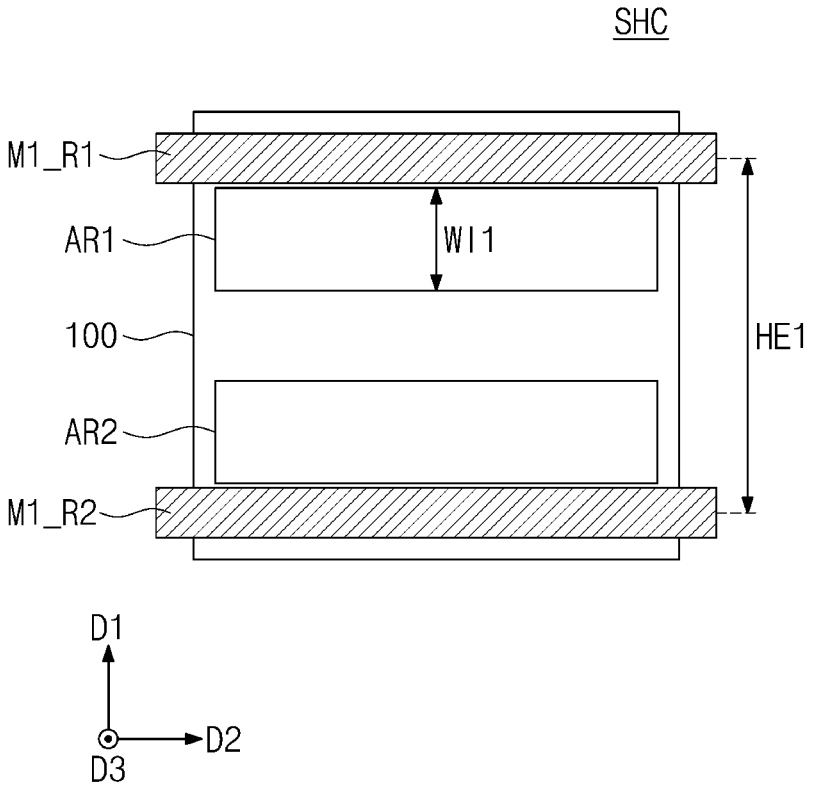
FIGS. 1 to 3 illustrate example conceptual diagrams showing logic cells of a semiconductor device.
Figure 2:
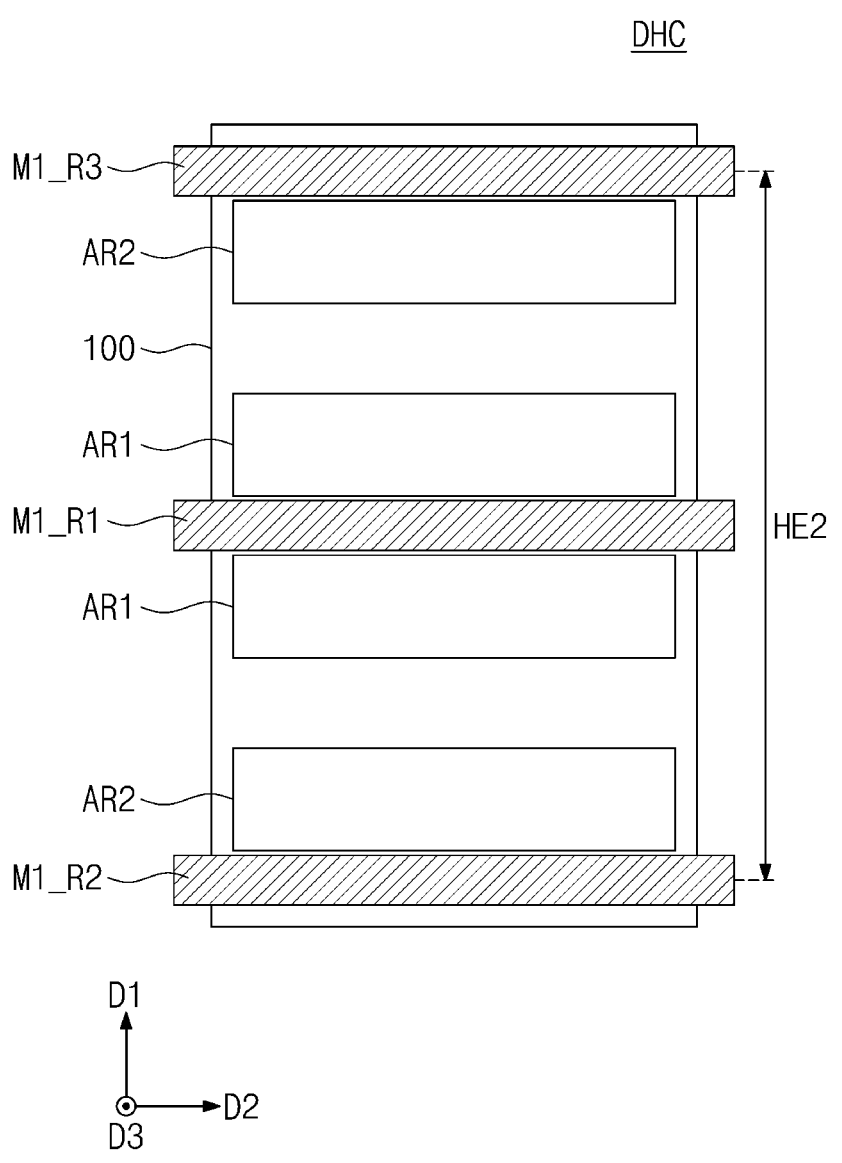
Figure 3:
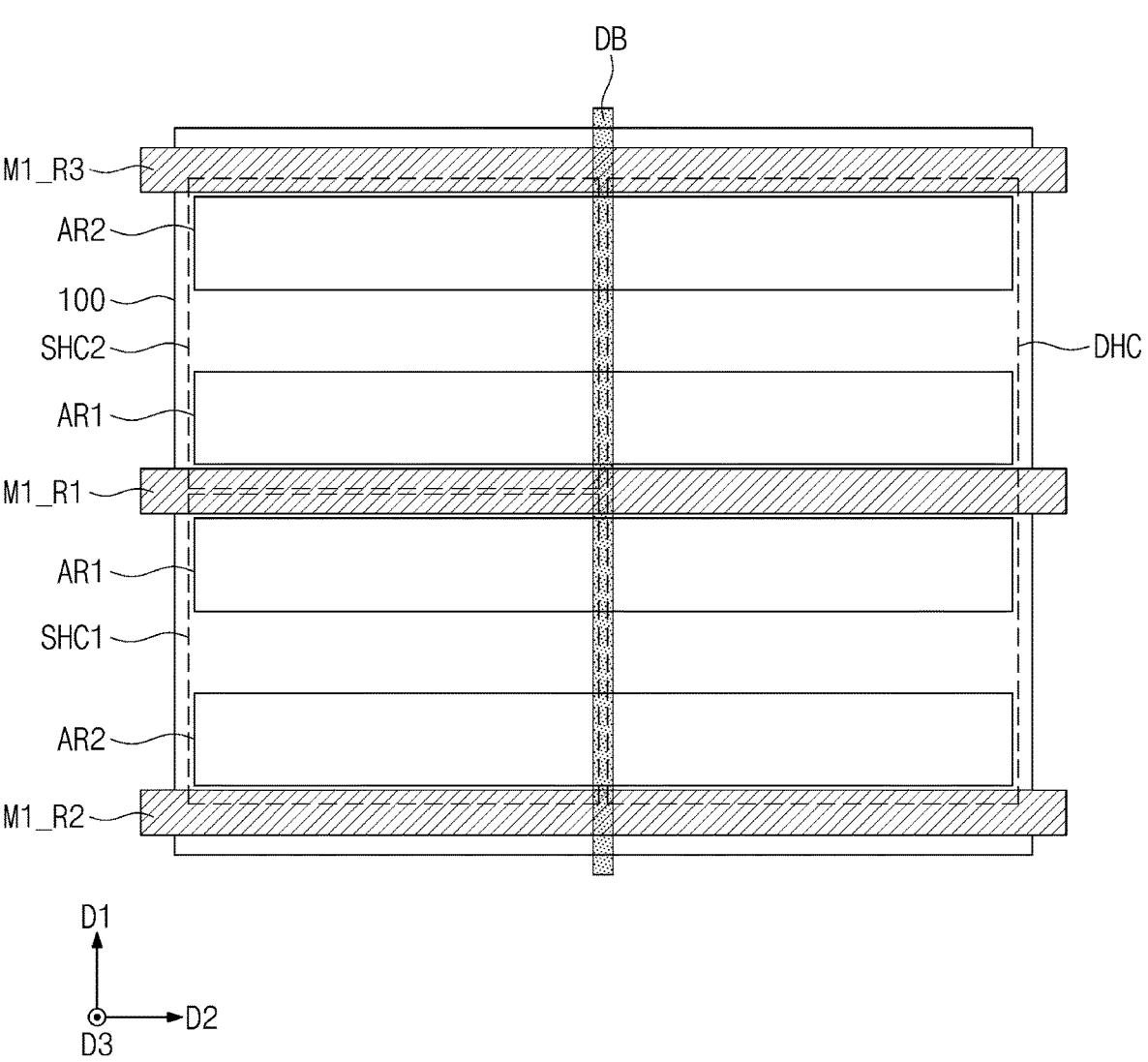

FIGS. 1 to 3 illustrate example conceptual diagrams showing logic cells of a semiconductor device.

Referring to FIG. 1, a single height cell SHC may be provided. For example, a substrate 100 may be provided thereon with a first power line M1_R1 and a second power line M1_R2. The third power line M1_R3 may be a path for providing a source voltage (VSS). For example, the first power line M1_R1 may be a path for providing a ground voltage. The second power line M1_R2 may be a path for providing a drain voltage (VDD). For example, the second power line M1_R2 may be a path for providing a power voltage. The single height cell SHC may be defined between the first power line M1_R1 and the second power line M1_R2. The single height cell SHC may include one first active region AR1 and one second active region AR2. One of the first and second active regions AR1 and AR2 may be a PMOSFET region, and the other of the first and second active regions AR1 and AR2 may be an NMOSFET region. For example, the single height cell SHC may have a complementary metal oxide semiconductor (CMOS) structure provided between the first power line M1_R1 and the second power line M1_R2.

Each of the first and second active regions AR1 and AR2 may have a first width WI1 in a first direction D1. A first height HE1 may be defined as a length in the first direction D1 of the single height cell SHC. The first height HE1 may be substantially the same as a distance (e.g., pitch) between the first power line M1_R1 and the second power line M1_R2.

The single height cell SHC may constitute one logic cell. In this description, the logic cell may mean a logic device, such as AND, OR, XOR, XNOR, and inverter, that performs a specific function. For example, the logic cell may include transistors for constituting a logic device, and may also include wiring lines that connect the transistors to each other.

Referring to FIG. 2, a double height cell DHC may be provided. For example, a substrate 100 may be provided thereon with a first power line M1_R1, a second power line M1_R2, and a third power line M1_R3. The first power line M1_R1 may be disposed between the second power line M1_R2 and the third power line M1_R3. The third power line M1_R3 may be a path for providing a source voltage (VSS).

The double height cell DHC may be defined between the second power line M1_R2 and the third power line M1_R3. The double height cell DHC may include two first active regions AR1 and two second active regions AR2.

One of the two second active regions AR2 may be adjacent to the second power line M1_R2. The other of the two second active regions AR2 may be adjacent to the third power line M1_R3. The two first active regions AR1 may be adjacent to the first power line M1_R1. When viewed in plan, the first power line M1_R1 may be disposed between the two first active regions AR1.

A second height HE2 may be defined to indicate a length in the first direction D1 of the double height cell DHC. The second height HE2 may be about twice the first height HE1 of FIG. 1. The two first active regions AR1 of the double height cell DHC may be collectively connected together to act as one active region.

The double height cell DHC shown in FIG. 2 may be defined as a multi-height cell. In some implementations, the multi-height cell may include a triple height cell whose cell height is about three times that of the single height cell SHC.

Referring to FIG. 3, a substrate 100 may be provided thereon with a first single height cell SHC1, a second single height cell SHC2, and a double height cell DHC that are two-dimensionally disposed. The first single height cell SHC1 may be disposed between a first power line M1_R1 and a second power line M1_R2. The second single height cell SHC2 may be disposed between the first power line M1_R1 and a third power line M1_R3. The second single height cell SHC2 may be adjacent in a first direction D1 to the first single height cell SHC1.

The double height cell DHC may be disposed between the second power line M1_R2 and the third power line M1_R3. The double height cell DHC may be adjacent in a second direction D2 to the first and second single height cells SHC1 and SHC2.

A separation structure DB may be provided between the first single height cell SHC1 and the double height cell DHC and between the second single height cell SHC2 and the double height cell DHC. The separation structure DB may electrically separate an active region of the double height cell DHC from an active region of each of the first and second single height cells SHC1 and SHC2.

Figure 4A:
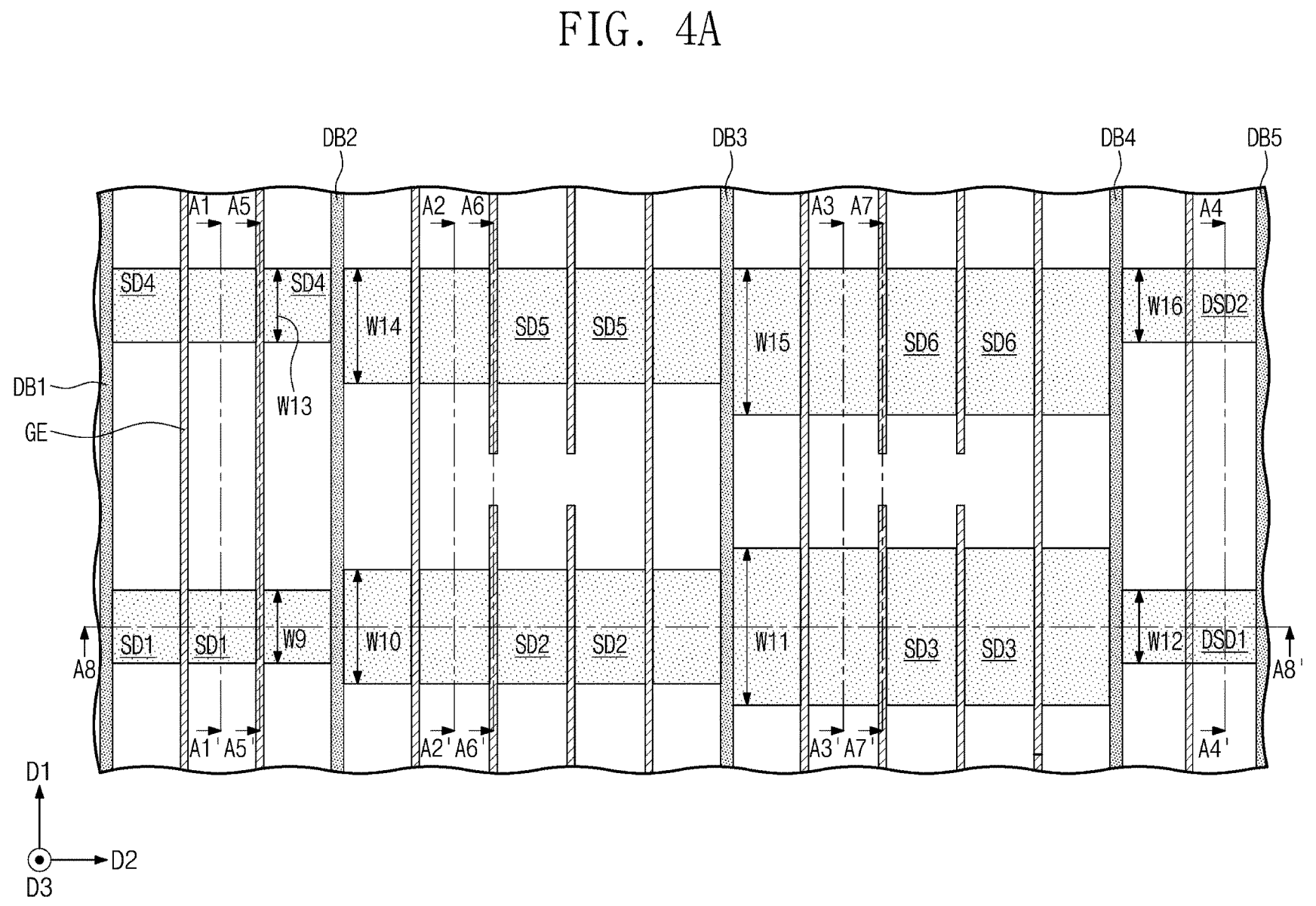
Figure 4B:
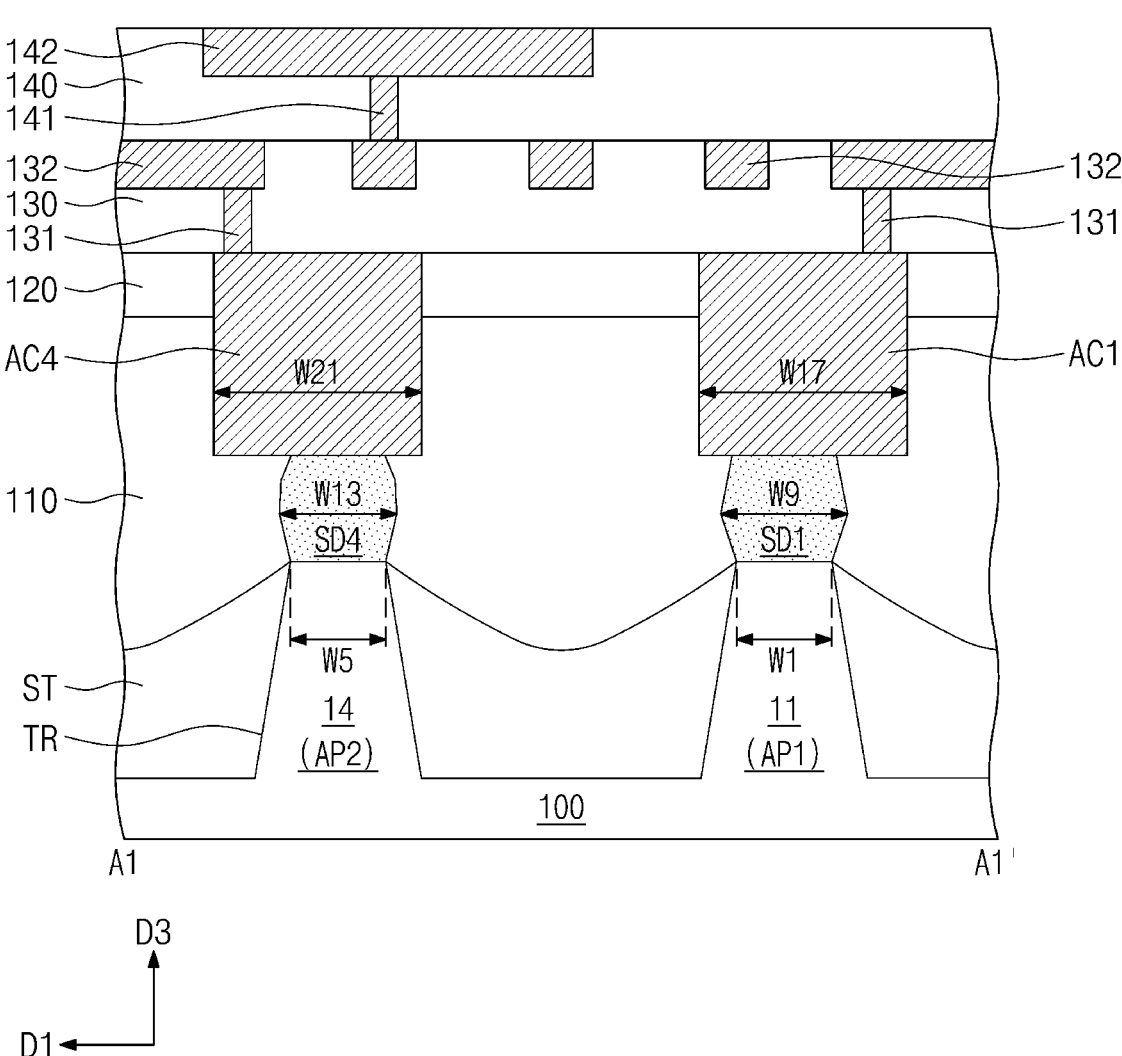
FIG. 4B illustrates an example cross-sectional view taken along line A1-A1' of FIG. 4A.
Figure 4C:
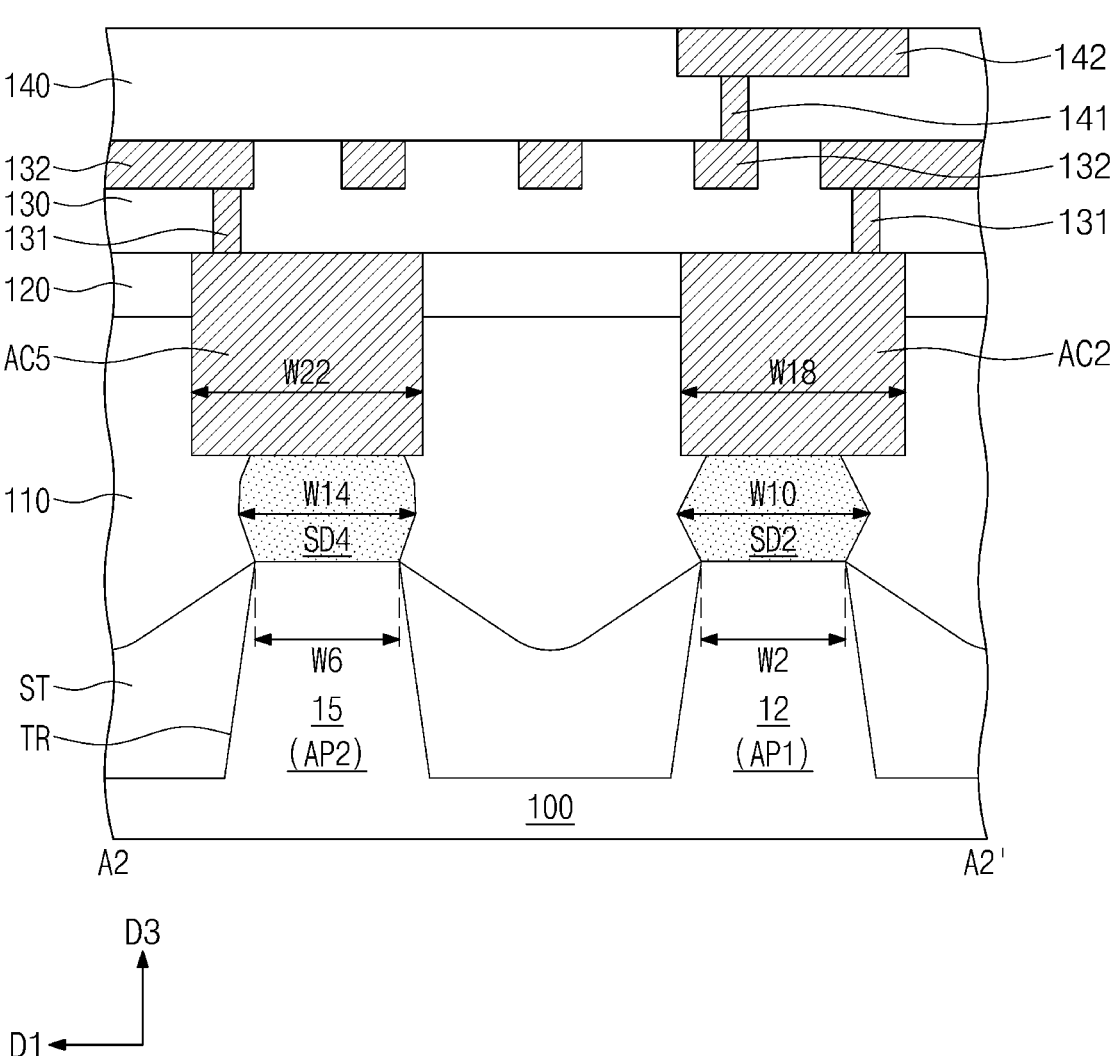
FIG. 4C illustrates an example cross-sectional view taken along line A2-A2' of FIG. 4A.
Figure 4D:
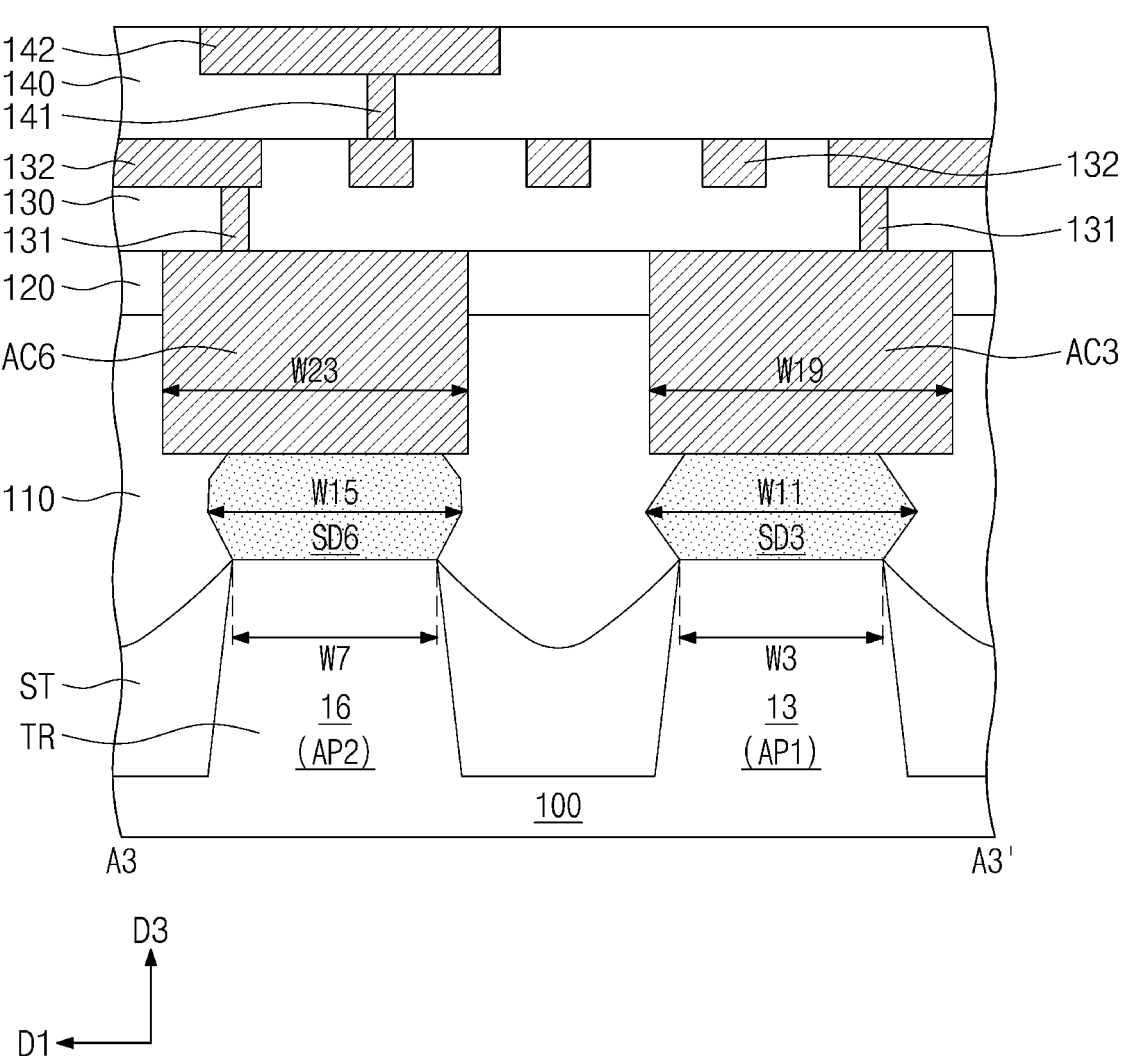
FIG. 4D illustrates an example cross-sectional view taken along line A3-A3' of FIG. 4A.
Figure 4E:
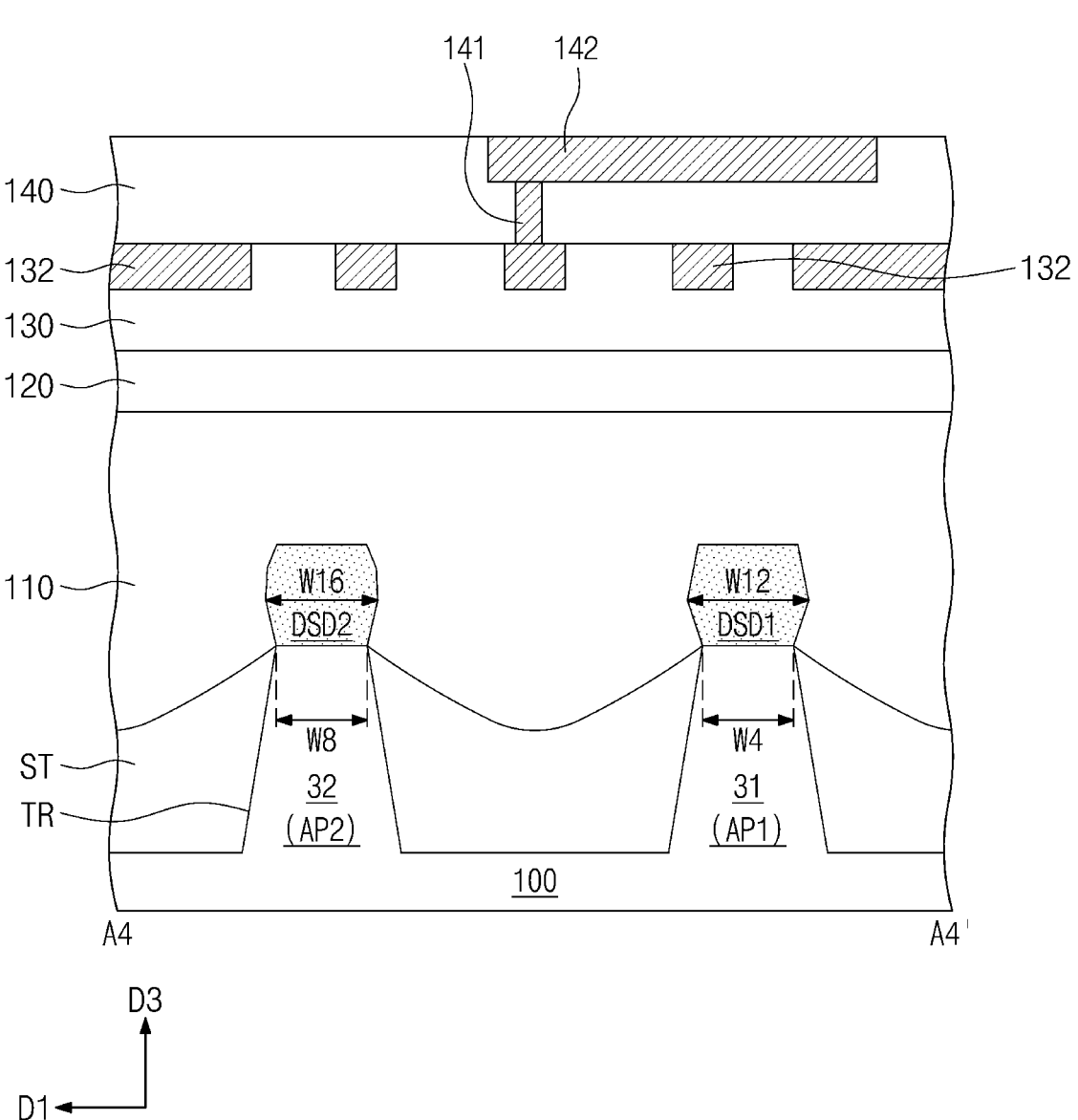
FIG. 4E illustrates an example cross-sectional view taken along line A4-A4' of FIG. 4A.
Figure 4F:
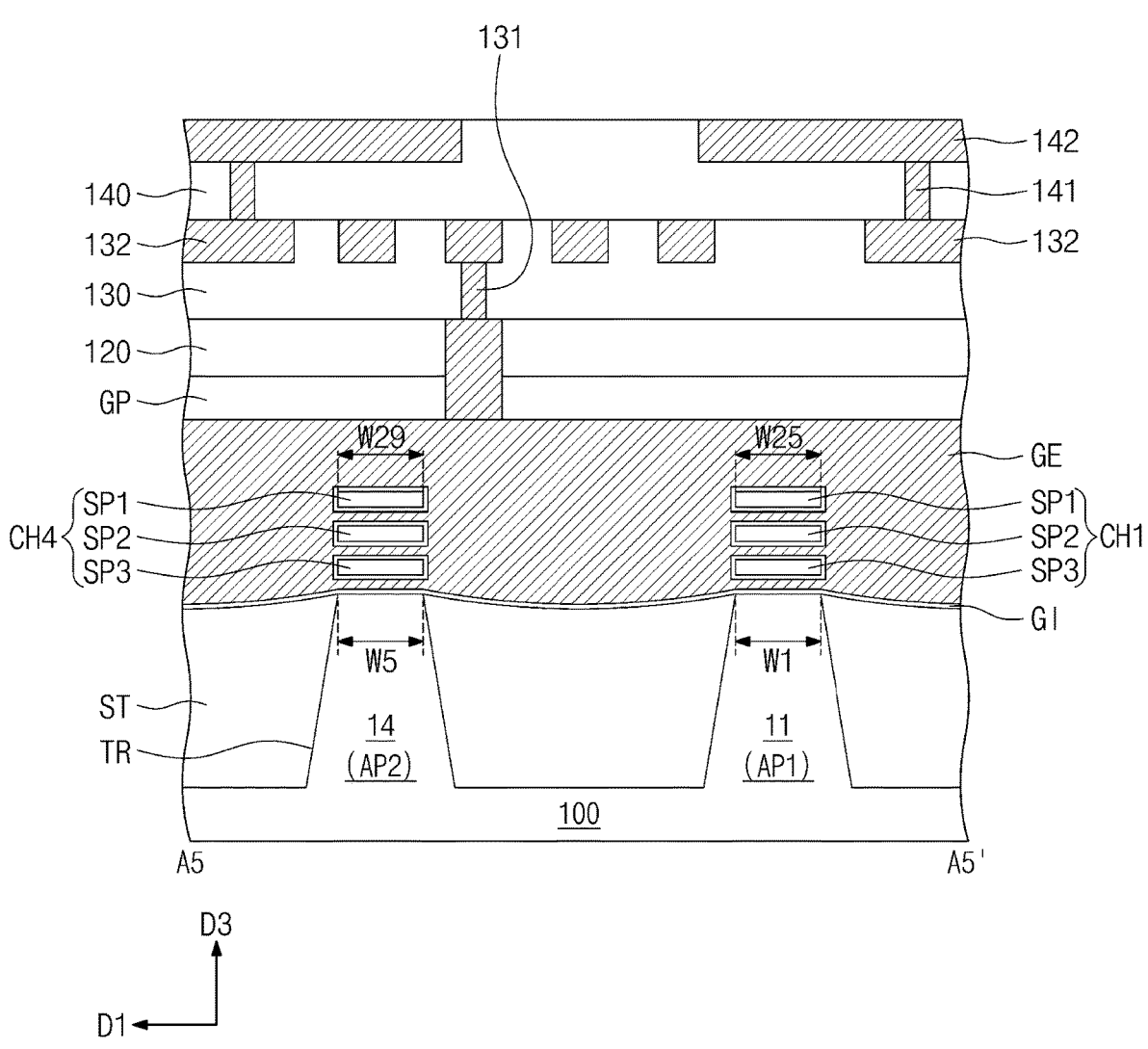
FIG. 4F illustrates an example cross-sectional view taken along line A5-A5' of FIG. 4A.
Figure 4G:
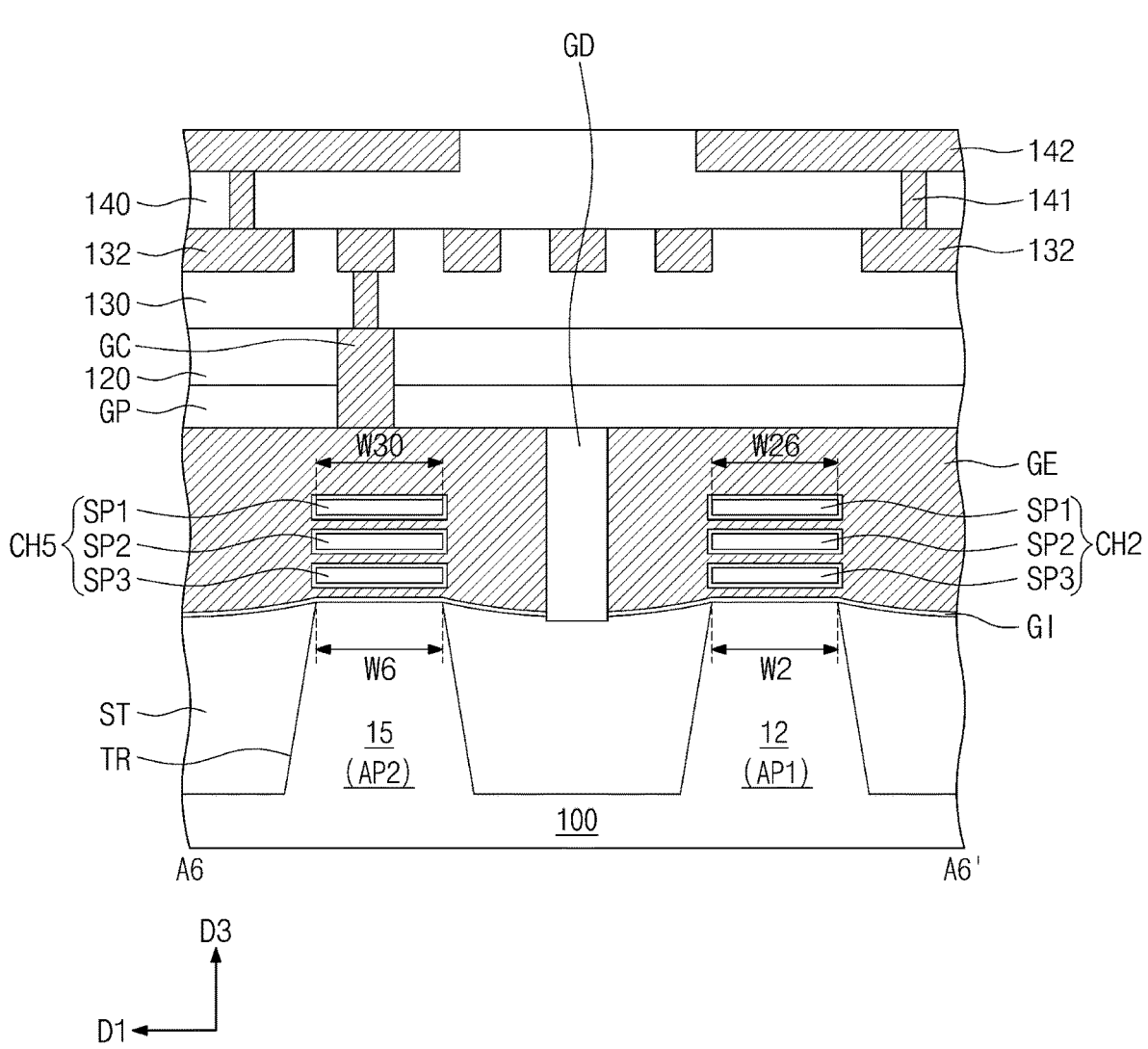
FIG. 4G illustrates an example cross-sectional view taken along line A6-A6' of FIG. 4A.
Figure 4H:
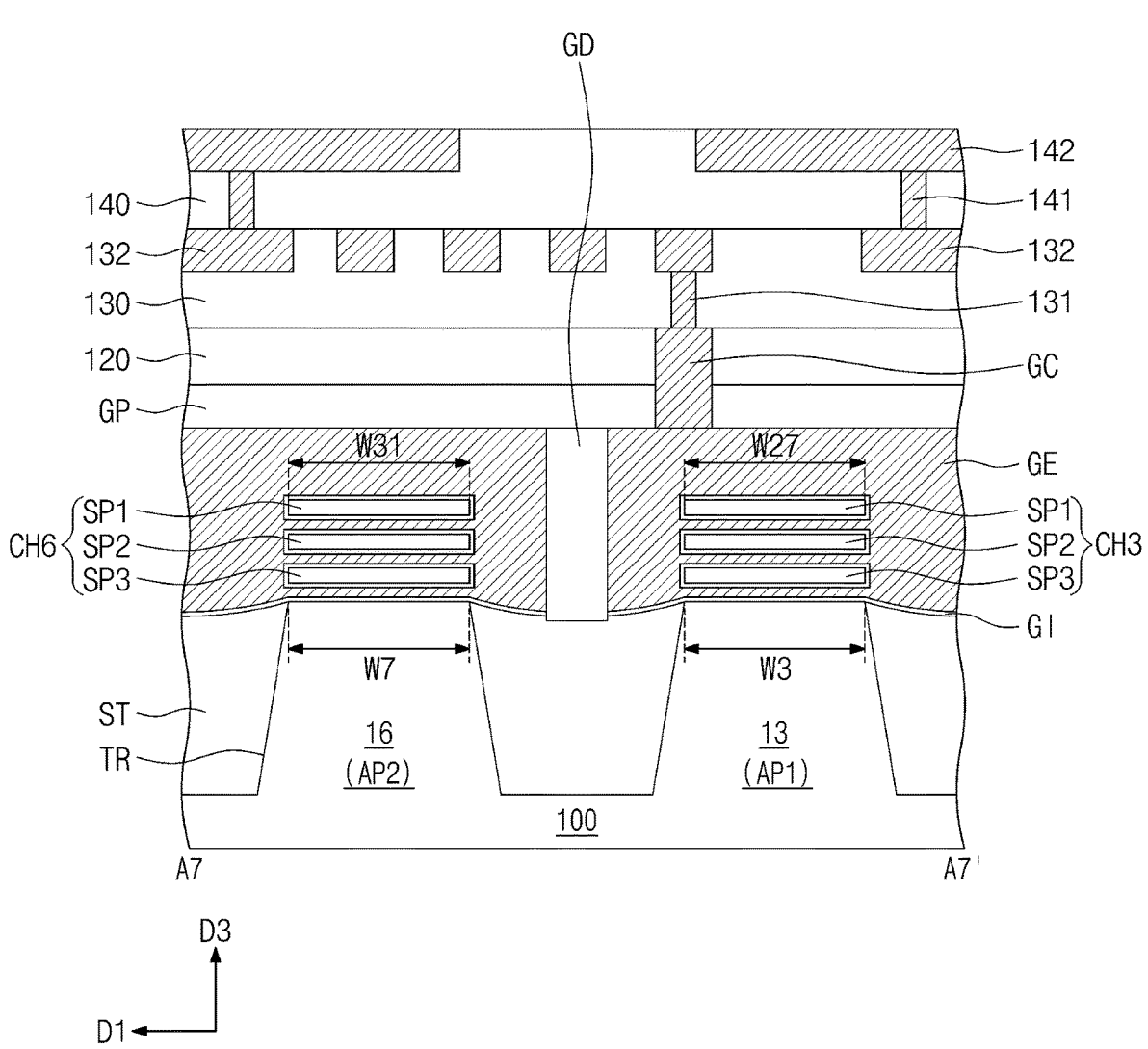
FIG. 4H illustrates an example cross-sectional view taken along line A7-A7' of FIG. 4A.
Figure 4I:
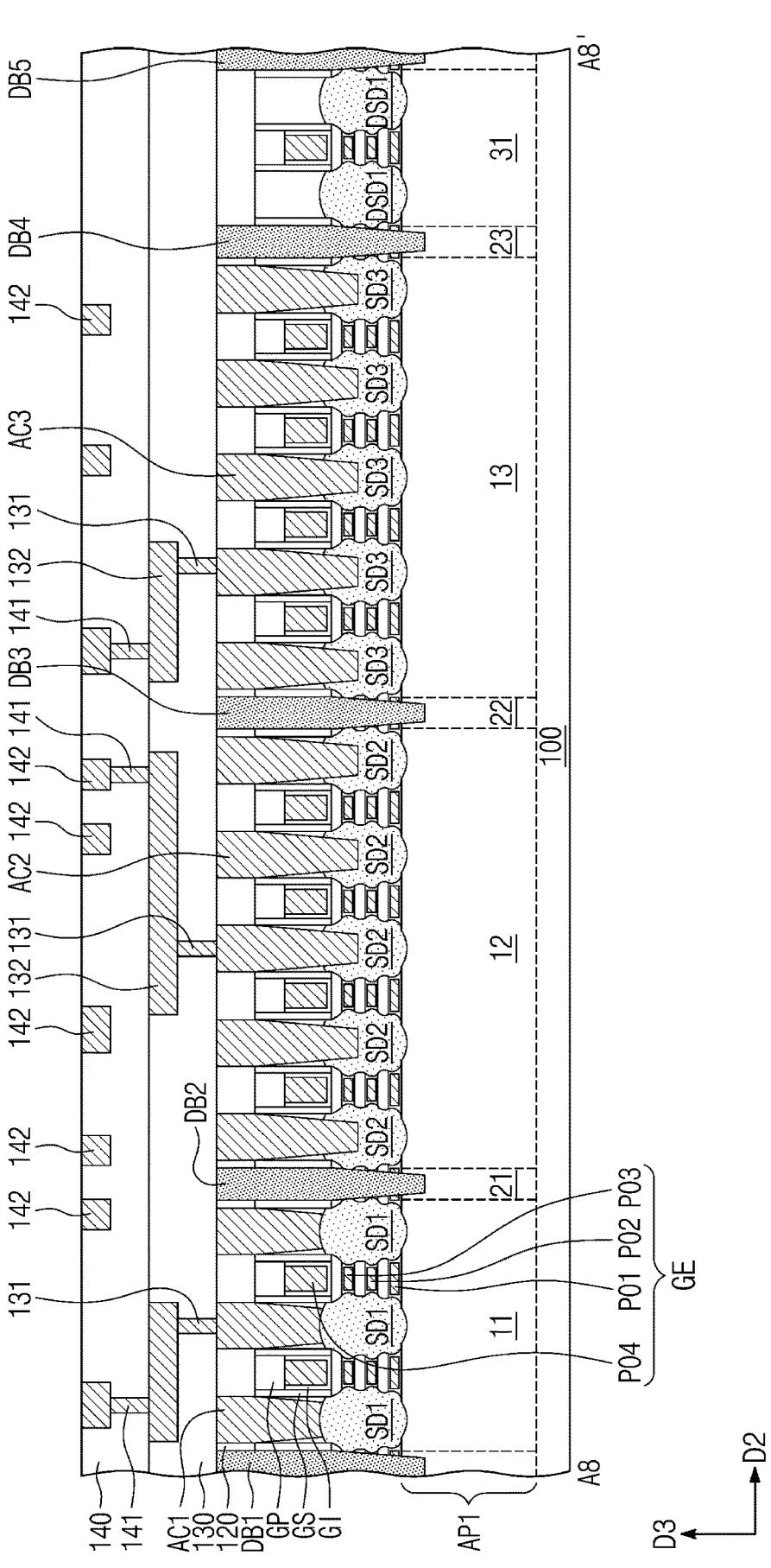
FIG. 4I illustrates an example cross-sectional view taken along line A8-A8' of FIG. 4A.
Figure 4J:
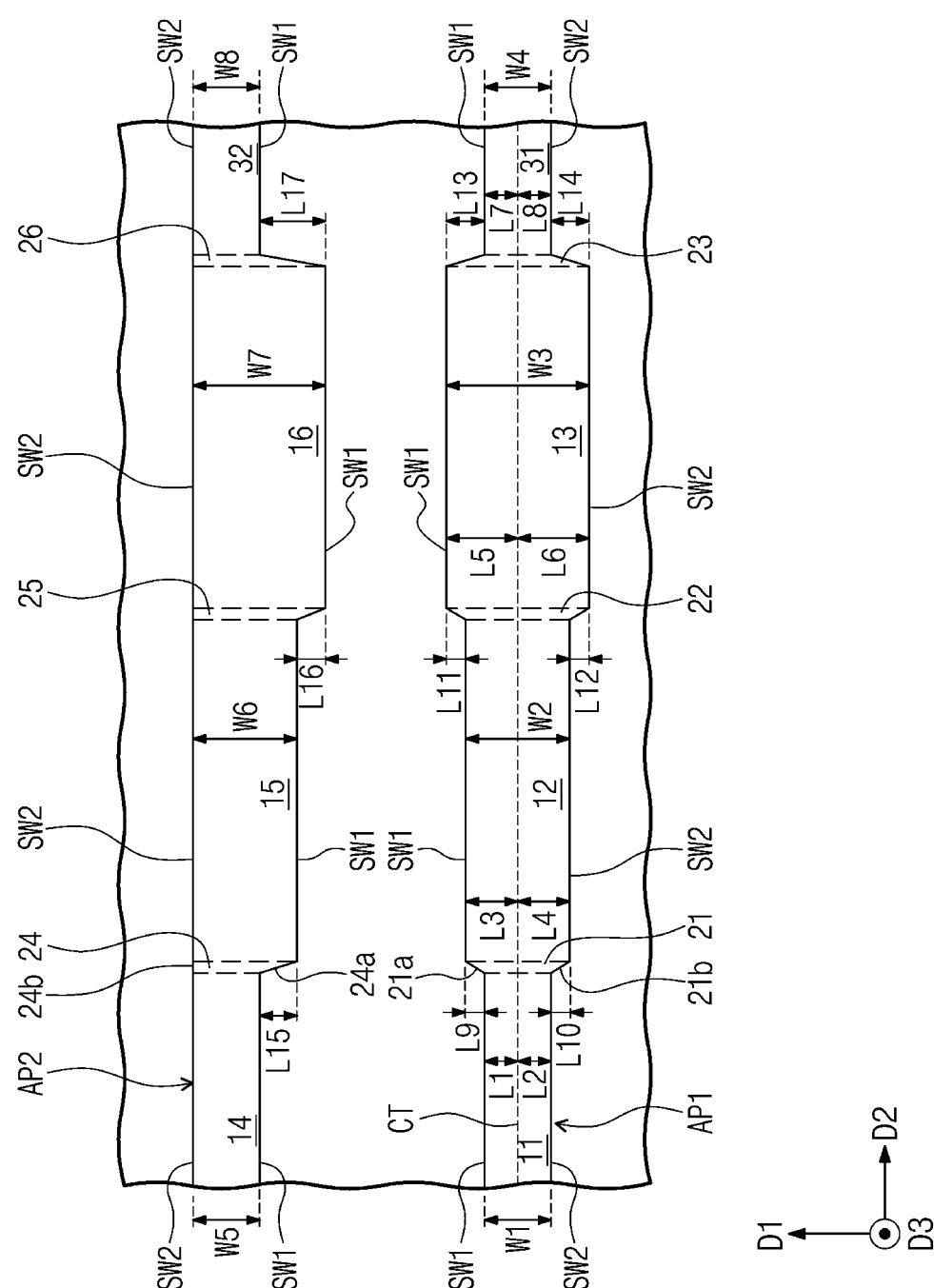
FIG. 4J illustrates an example plan view showing active patterns the semiconductor device of FIG. 4A.

FIG. 4A illustrates an example plan view showing a semiconductor device. FIG. 4B illustrates an example cross-sectional view taken along line A1-A1' of FIG. 4A. FIG. 4C illustrates an example cross-sectional view taken along line A2-A2' of FIG. 4A. FIG. 4D illustrates an example cross-sectional view taken along line A3-A3' of FIG. 4A. FIG. 4E illustrates an example cross-sectional view taken along line A4-A4' of FIG. 4A. FIG. 4F illustrates an example cross-sectional view taken along line A5-A5' of FIG. 4A. FIG. 4G illustrates an example cross-sectional view taken along line A6-A6' of FIG. 4A. FIG. 4H illustrates an example cross-sectional view taken along line A7-A7' of FIG. 4A. FIG. 4I illustrates an example cross-sectional view taken along line A8-A8' of FIG. 4A. FIG. 4J illustrates an example plan view showing active patterns the semiconductor device of FIG. 4A.

Referring to FIGS. 4A to 4J, a semiconductor device may include a substrate 100. A logic cell may be disposed on the substrate 100. In some implementations, the substrate 100 may be a semiconductor substrate. For example, the substrate 100 may include silicon (Si), germanium (Ge), silicon-germanium (SiGe), gallium phosphide (GaP), or gallium arsenide (GaAs). In some implementations, the substrate 100 may be a silicon-on-insulator (SOI) substrate or a germanium-on-insulator (GOI) substrate. The substrate 100 may have a plate shape that extends along a plane elongated in a first direction D1 and a second direction D2. The first direction D1 and the second direction D2 may intersect each other. For example, the first direction D1 and the second direction D2 may be horizontal directions that are orthogonal to each other.

The substrate 100 may include a first active region and a second active region. The first and second active regions may extend in the second direction D2. In some implementations, the first active region may be a PMOSFET region, and the second active region may be an NMOSFET region.

The substrate 100 may include a first active pattern AP1 and a second active pattern AP2. The first active pattern AP1 and the second active pattern AP2 may be defined by a trench TR on the substrate 100. The first active pattern AP1 may be provided on the first active region, and the second active pattern AP2 may be provided on the second active region. The first and second active patterns AP1 and AP2 may extend in the second direction D2. The first and second active patterns AP1 and AP2 may be portions of the substrate 100 that protrude in a third direction D3. The third direction D3 may intersect the first direction D1 and the second direction D2. For example, the third direction D3 may be a vertical direction perpendicular to the first direction D1 and the second direction D2.

A device isolation layer ST may be provided on the substrate 100. The device isolation layer ST may fill the trench TR. The device isolation layer ST may include a dielectric material. For example, the device isolation layer ST may include oxide or nitride.

First channel patterns CH1, second channel patterns CH2, and third channel patterns CH3 may be provided to overlap in the third direction D3 with the first active pattern AP1. Fourth channel patterns CH4, fifth channel patterns CH5, and sixth channel patterns CH6 may be provided to overlap in the third direction D3 with the second active pattern AP2.

Each of the first, second, third, fourth, fifth, and sixth channel pattern CH1, CH2, CH3, CH4, CH5, and CH6 may include a first semiconductor pattern SP1, a second semiconductor pattern SP2, and a third semiconductor pattern SP3. The first, second, and third semiconductor patterns SP1, SP2, and SP3 may be spaced apart from each other in the third direction D3.

In some implementations, the first, second, and third semiconductor patterns SP1, SP2, and SP3 may include silicon (Si). For example, each of the first, second, and third semiconductor patterns SP1, SP2, and SP3 may include crystalline silicon. In some implementations, the first, second, and third semiconductor patterns SP1, SP2, and SP3 may include silicon-germanium (SiGe).

The first active pattern AP1 may be provided thereon with first source/drain patterns SD1, second source/drain patterns SD2, third source/drain patterns SD3, and first dummy source/drain patterns DSD1. The second active pattern AP2 may be provided thereon with fourth source/drain patterns SD4, fifth source/drain patterns SD5, sixth source/drain patterns SD6, and second dummy source/drain patterns DSD2.

In some implementations, the number of the first dummy source/drain patterns DSD1 may be three or higher, and the number of the second dummy source/drain patterns DSD2 may be three or higher.

The first channel pattern CH1 may be interposed between neighboring first source/drain patterns SD1. The second channel pattern CH2 may be interposed between neighboring second source/drain patterns SD2. The third channel pattern CH3 may be interposed between neighboring third source/drain patterns SD3. The fourth channel pattern CH4 may be interposed between neighboring fourth source/drain patterns SD4. The fifth channel pattern CH5 may be interposed between neighboring fifth source/drain patterns SD5. The sixth channel pattern CH6 may be interposed between neighboring source/drain patterns SD6. The first, second, and third semiconductor patterns SP1, SP2, and SP3 of the first channel pattern CH1 may connect neighboring first source/drain patterns SD1 to each other.

The first, second, third, fourth, fifth, and sixth source/drain patterns SD1, SD2, SD3, SD4, SD5, and SD6 may be epitaxial patterns formed by a selective epitaxial growth (SEG) process. In some implementations, the first, second, and third source/drain patterns SD1, SD2, and SD3 may have a p-type conductivity, and the fourth, fifth, and sixth source/drain patterns SD4, SD5, and SD6 may have an n-type conductivity. In some implementations, the fourth, fifth, and sixth source/drain patterns SD4, SD5, and SD6 may include the same semiconductor material (e.g., Si) as that of the substrate 100, and the first, second, and third source/drain patterns SD1, SD2, and SD3 may include a semiconductor material (e.g., SiGe) whose lattice constant is greater than that of a semiconductor material of the substrate 100. Therefore, the first, second, and third source/drain patterns SD1, SD2, and SD3 may provide a compressive stress to the first, second, and third channel patterns CH1, CH2, and CH3 therebetween.

Gate electrodes GE may be provided which extend in the first direction D1. The gate electrode GE may intersect one or more of the first and second active patterns AP1 and AP2. The gate electrode GE may intersect one or more of the first, second, third, fourth, fifth, and sixth channel patterns CH1, CH2, CH3, CH4, CH5, and CH6. The gate electrode GE may overlap in the third direction D3 with the first, second, and third semiconductor patterns SP1, SP2, and SP3 of one or more of the first, second, third, fourth, fifth, and sixth channel patterns CH1, CH2, CH3, CH4, CH5, and CH6.

The gate electrode GE may include a first portion PO1 interposed between the third semiconductor pattern SP3 and the active pattern AP1 or AP2, a second portion PO2 interposed between third semiconductor pattern SP3 and the second semiconductor pattern SP2, a third portion PO3 interposed between the second semiconductor pattern SP2 and the first semiconductor pattern SP1, and a fourth portion PO4 on the first semiconductor pattern SP1. The gate electrode GE may include a conductive material.

The gate electrode GE and the first, second, and third semiconductor patterns SP1, SP2, and SP3 may constitute a three-dimensional field effect transistor (e.g., MBCFET or GAAFET).

Gate separation layers GD may be provided. The gate separation layer GD may be interposed between the gate electrodes GE that are adjacent to each other in the first direction D1. The gate separation layer GD may separate from each other the gate electrodes GE that are adjacent to each other in the first direction D1. The gate separation layer GD may include a dielectric material.

A pair of gate spacers GS may be disposed on opposite sidewalls of the gate electrode GE. The gate spacers GS may extend in the first direction D1 along the gate electrode GE. The gate spacers GS may have their top surfaces higher than that of the gate electrode GE. The top surfaces of the gate spacers GS may be coplanar with that of a first interlayer dielectric layer 110 which will be discussed below.

A gate capping pattern GP may be provided on the gate electrode GE. The gate capping pattern GP may extend in the first direction D1 along the gate electrode GE. The gate capping pattern GP may include a dielectric material having an etch selectivity with respect to first and second interlayer dielectric layers 110 and 120 which will be discussed below. For example, the gate capping pattern GP may include nitride.

A gate dielectric layer GI may be provided. The gate dielectric layer GI may separate the gate electrode GE from the first, second, third, fourth, fifth, and sixth channel patterns CH1, CH2, CH3, CH4, CH5, and CH6. The gate dielectric layer GI may cover a top surface, a bottom surface, and a sidewall of each of the first, second, and third semiconductor patterns SP1, SP2, and SP3. The gate dielectric layer GI may cover the device isolation layer ST. The gate dielectric layer GI may include a dielectric material. For example, the gate dielectric layer GI may include oxide.

A first interlayer dielectric layer 110 may be formed to cover the first, second, third, fourth, fifth, and sixth source/drain patterns SD1, SD2, SD3, SD4, SD5, and SD6. The first interlayer dielectric layer 110 may have a top surface substantially coplanar with that of the gate capping pattern GP and that of the gate spacer GS. The first interlayer dielectric layer 110 may be provided thereon with a second interlayer dielectric layer 120 that covers the gate capping pattern GP. A third interlayer dielectric layer 130 may be provided on the second interlayer dielectric layer 120. A fourth interlayer dielectric layer 140 may be provided on the third interlayer dielectric layer 130. The first, second, third, and fourth interlayer dielectric layers 110, 120, 130, and 140 may include a dielectric material. For example, the first, second, third, and fourth interlayer dielectric layers 110, 120, 130, and 140 may include oxide.

First, second, third, fourth, and fifth separation structures DB1, DB2, DB3, DB4, and DB5 may be provided. The first, second, third, fourth, and fifth separation structures DB1, DB2, DB3, DB4, and DB5 may extend in the first direction D1. The gate electrodes GE may be provided between the first, second, third, fourth, and fifth separation structures DB1, DB2, DB3, DB4, and DB5.

Each of the first, second, third, fourth, and fifth separation structures DB1, DB2, DB3, DB4, and DB5 may penetrate the first and second interlayer dielectric layers 110 and 120. The first, second, third, fourth, and fifth separation structures DB1, DB2, DB3, DB4, and DB5 may have their lower portions that penetrate in the first direction D1 through an upper portion of each of the first and second active patterns AP1 and AP2. The first, second, third, fourth, and fifth separation structures DB1, DB2, DB3, DB4, and DB5 may have their bottom surfaces lower than top surfaces of the first and second active patterns AP1 and AP2. The bottom surface of each of the first, second, third, fourth, and fifth separation structures DB1, DB2, DB3, DB4, and DB5 may be located at a level higher than that of a bottom surface of the device isolation layer ST.

The first and fourth source/drain patterns SD1 and SD4 may be disposed between the first and second separation structures DB1 and DB2. The second and fifth source/drain patterns SD2 and SD5 may be disposed between the second and third separation structures DB2 and DB3. The third and sixth source/drain patterns SD3 and SD6 may be disposed between the third and fourth separation structures DB3 and DB4. The first and second dummy source/drain patterns DSD1 and DSD2 may be disposed between the fourth and fifth separation structures DB4 and DB5.

The second separation structure DB2 may be disposed between the first and second source/drain patterns SD1 and SD2 that are adjacent to each other. The second separation structure DB2 may be disposed between the fourth and fifth source/drain patterns SD4 and SD5 that are adjacent to each other. The third separation structure DB3 may be disposed between the second and third source/drain patterns SD2 and SD3 that are adjacent to each other. The third separation structure DB3 may be disposed between the fifth and sixth source/drain patterns SD5 and SD6 that are adjacent to each other. The fourth separation structure DB4 may be disposed between the third source/drain pattern SD3 and the first dummy source/drain pattern DSD1 that are adjacent to each other. The fourth separation structure DB4 may be disposed between the sixth source/drain pattern SD6 and the second dummy source/drain pattern DSD2 that are adjacent to each other.

First, second, third, fourth, fifth, and sixth active contacts AC1, AC2, AC3, AC4, AC5, and AC6 may be provided to penetrate the first and second interlayer dielectric layers 110 and 120. The first active contact AC1 may be electrically connected to the first source/drain pattern SD1. The second active contact AC2 may be electrically connected to the second source/drain pattern SD2. The third active contact AC3 may be electrically connected to the third source/drain pattern SD3. The fourth active contact AC4 may be electrically connected to the fourth source/drain pattern SD4. The fifth active contact AC5 may be electrically connected to the fifth source/drain pattern SD5. The sixth active contact AC6 may be electrically connected to the sixth source/drain pattern SD6.

As there is no active contact electrically connected to the first and second dummy source/drain patterns DSD1 and DSD2, the first and second dummy source/drain patterns DSD1 and DSD2 may be electrically floated.

The gate electrode GE may be provided between neighboring active contacts AC1, AC2, AC3, AC4, AC5, and AC6. When viewed in plan, each of the first, second, third, fourth, fifth, and sixth active contacts AC1, AC2, AC3, AC4, AC5, and AC6 may have a bar shape that extends in the first direction D1.

In some implementations, a metal-semiconductor compound layer may be interposed between each of the active contacts AC1, AC2, AC3, AC4, AC5, and AC6 and one of the source/drain patterns SD1, SD2, SD3, SD4, SD5, and SD6. In this case, each of the active contacts AC1, AC2, AC3, AC4, AC5, and AC6 may be electrically connected through the metal-semiconductor compound layer to a corresponding one of the source/drain patterns SD1, SD2, SD3, SD4, SD5, and SD6. For example, the metal-semiconductor compound layer may include at least one selected from titanium-silicide, tantalum-silicide, tungsten-silicide, nickel-silicide, and cobalt-silicide.

In some implementations, each of the active contacts AC1, AC2, AC3, AC4, AC5, and AC6 may include a conductive pattern and a barrier pattern. The barrier pattern may cover sidewalls and a bottom surface of the conductive pattern. For example, the conductive pattern may include at least one selected from aluminum, copper, tungsten, molybdenum, and cobalt, and the barrier pattern may include at least one selected from titanium, tantalum, tungsten, nickel, cobalt, titanium nitride (TiN), tantalum nitride (TaN), tungsten nitride (WN), nickel nitride (NiN), cobalt nitride (CON), and platinum nitride (PtN).

Gate contacts GC may be provided. The gate contact GC may penetrate the second interlayer dielectric layer 120 and the gate capping pattern GP. The gate contact GC may be connected to the gate electrode GE. The gate contact GC may include a conductive material.

First contacts 131 may be provided in the third interlayer dielectric layer 130. The first contact 131 may include a conductive material. One of the first contacts 131 may be connected to one of the active contacts AC1, AC2, AC3, AC4, AC5, and AC6, and another of the first contacts 131 may be connected to the gate contact GC.

First conductive lines 132 may be provided in the third interlayer dielectric layer 130. At least one of the first conductive lines 132 may be connected to the first contact 131. At least one of the first conductive lines 132 may be a power line. The first conductive line 132 may include a conductive material.

Second contacts 141 may be provided in the fourth interlayer dielectric layer 140. At least one of the second contacts 141 may be connected to the first conductive line 132. The second contact 141 may include a conductive material.

Second conductive lines 142 may be provided in the fourth interlayer dielectric layer 140. At least one of the second conductive lines 142 may be connected to the second contact 141. The second conductive line 142 may include a conductive material.

The first active pattern AP1 may include a first active portion 11 that overlaps in the third direction D3 with the first source/drain patterns SD1, a first intervening portion 21 that overlaps in the third direction D3 with the second separation structure DB2, a second active portion 12 that overlaps in the third direction D3 with the second source/drain patterns SD2, a second intervening portion 22 that overlaps in the third direction D3 with the third separation structure DB3, a third active portion 13 that overlaps in the third direction D3 with the third source/drain patterns SD3, a third intervening portion 23 that overlaps in the third direction D3 with the fourth separation structure DB4, and a first dummy portion 31 that overlaps in the third direction D3 with the first dummy source/drain pattern DSD1. The first, second, and third active portions 11, 12, and 13, the first, second, and third intervening portions 21, 22, and 23, and the first dummy portion 31 may be arranged along the second direction D2.

In some implementations, a length in the second direction D2 of the first dummy portion 31 may be greater than a length in the second direction D2 of each of the first active portion 11, the second active portion 12, and the third active portion 13.

The first intervening portion 21 may be disposed between the first and second active portions 11 and 12. The first intervening portion 21 may be connected to the first and second active portions 11 and 12. The second intervening portion 22 may be disposed between the second and third active portions 12 and 13. The second intervening portion 22 may be connected to the second and third active portions 12 and 13. The third intervening portion 23 may be disposed between the third active portion 13 and the first dummy portion 31. The third intervening portion 23 may be connected to the third active portion 13 and the first dummy portion 31.

The first active portion 11 may be disposed between the first and second separation structures DB1 and DB2. A portion of a bottom surface of the second separation structure DB2 may be disposed in the first intervening portion 21.

The second active pattern AP2 may include a fourth active portion 14 that overlaps in the third direction D3 with the fourth source/drain patterns SD4, a fourth intervening portion 24 that overlaps in the third direction D3 with the second separation structure DB2, a fifth active portion 15 that overlaps in the third direction D3 with the fifth source/drain patterns SD5, a fifth intervening portion 25 that overlaps in the third direction D3 with the third separation structure DB3, a sixth active portion 16 that overlaps in the third direction D3 with the sixth source/drain patterns SD6, a sixth intervening portion 26 that overlaps in the third direction D3 with the fourth separation structure DB4, and a second dummy portion 32 that overlaps in the third direction D3 with the second dummy source/drain pattern DSD2.

In some implementations, a length in the second direction D2 of the second dummy portion 32 may be greater than a length in the second direction D2 of each of the fourth active portion 14, the fifth active portion 15, and the sixth active portion 16.

The fourth intervening portion 24 may be disposed between the fourth and fifth active portions 14 and 15. The fifth intervening portion 25 may be disposed between the fifth and sixth active portions 15 and 16. The sixth intervening portion 26 may be disposed between the sixth active portion 16 and the second dummy portion 32.

The fourth active portion 14 may be disposed between the first and second separation structures DB1 and DB2. A portion of the bottom surface of the second separation structure DB2 may be disposed in the fourth intervening portion 24.

A width in the first direction D1 of the first active portion 11 may be less than a width in the first direction D1 of the second active portion 12. For example, a first minimum width W1 in the first direction D1 of the first active portion 11 may be less than a second minimum width W2 in the first direction D1 of the second active portion 12. The width in the first direction D1 of the second active portion 12 may be less than a width in the first direction D1 of the third active portion 13. For example, the second minimum width W2 may be less than a third minimum width W3 in the first direction D1 of the third active portion 13. The width in the first direction D1 of the third active portion 13 may be greater than a width in the first direction D1 of the first dummy portion 31. For example, the third minimum width W3 may be greater than a fourth minimum width W4 in the first direction D1 of the first dummy portion 31.

A width in the first direction D1 of the fourth active portion 14 may be less than a width in the first direction D1 of the fifth active portion 15. For example, a fifth minimum width W5 in the first direction D1 of the fourth active portion 14 may be less than a sixth minimum width W6 in the first direction D1 of the second active portion 12. The width in the first direction D1 of the fifth active portion 15 may be less than a width in the first direction D1 of the sixth active portion 16. For example, the sixth width W6 may be less than a seventh minimum width W7 in the first direction D1 of the sixth active portion 16. The width in the first direction D1 of the sixth active portion 16 may be greater than a width in the first direction D1 of the second dummy portion 32. For example, the seventh minimum width W7 may be greater than an eighth minimum width W8 in the first direction D1 of the second dummy portion 32.

A difference between the first and second minimum widths W1 and W2 and a difference between the second and third minimum widths W2 and W3 may be less than a difference between the fourth and third minimum widths W4 and W3. A difference between the fifth and sixth minimum widths W5 and W6 and a difference between the sixth and seventh minimum widths W6 and W7 may be less than a difference between the eighth and seventh minimum widths W8 and W7.

In some implementations, the first, fourth, fifth, and eighth minimum widths W1, W4, W5, and W8 may be the same as each other, the second and sixth minimum widths W2 and W6 may be the same as each other, and the third and seventh minimum widths W3 and W7 may be the same as each other.

In some implementations, the first, fourth, fifth, and eighth minimum widths W1, W4, W5, and W8 may be different from each other, the second and sixth minimum widths W2 and W6 may be different from each other, and the third and seventh minimum widths W3 and W7 may be different from each other.

A central line CT of the first active pattern AP1 may be defined. The central line CT may extend in the second direction D2. The central line CT may be an imaginary line that overlaps in the third direction D3 with centers of the first, second, and third active portions 11, 12, and 13, centers of the first, second, and third intervening portions 21, 22, and 23, and a center of the first dummy portion 31.

Each of the first, second, third, fourth, fifth, and sixth active portions 11, 12, 13, 14, 15, and 16 and the first and second dummy portions 31 and 32 may have a first sidewall SW1 and a second sidewall SW2 opposite to the first sidewall SW1. The first sidewall SW1 of each of the first, second, and third active portions 11, 12, and 13 and the first dummy portion 31 may face the second active pattern AP2. The first sidewall SW1 of each of the fourth, fifth, and sixth active portions 14, 15, and 16 and the second dummy portion 32 may face the first active pattern AP1.

The first, second, and third active portions 11, 12, and 13 and the first dummy portion 31 may each be symmetrically disposed about the central line CT. The first sidewall SW1 and the second sidewall SW2 of each of the first, second, and third active portions 11, 12, and 13, and the first dummy portion 31 may be disposed symmetric to each other about the central line CT. A distance in the first direction D1 between the central line CT and the first sidewall SW1 of the first active portion 11 may be the same as a distance in the first direction D1 between the central line CT and the second sidewall SW2 of the first active portion 11. For example, a first minimum distance L1 in the first direction D1 between the central line CT and the first sidewall SW1 of the first active portion 11 may be the same as a second minimum distance L2 in the first direction D1 between the central line CT and the second sidewall SW2 of the first active portion 11. The first minimum distance L1 may be, for example, a distance in the first direction D1 between the central line CT and an uppermost portion of the first sidewall SW1 of the first active portion 11.

A distance in the first direction D1 between the central line CT and the first sidewall SW1 of the second active portion 12 may be the same as a distance in the first direction D1 between the central line CT and the second sidewall SW2 of the second active portion 12. For example, a third minimum distance L3 in the first direction D1 between the central line CT and the first sidewall SW1 of the second active portion 12 may be the same as a fourth minimum distance L4 in the first direction D1 between the central line CT and the second sidewall SW2 of the second active portion 12.

A distance in the first direction D1 between the central line CT and the first sidewall SW1 of the third active portion 13 may be the same as a distance in the first direction D1 between the central line CT and the second sidewall SW2 of the third active portion 13. For example, a fifth minimum distance L5 in the first direction D1 between the central line CT and the first sidewall SW1 of the third active portion 13 may be the same as a sixth minimum distance L6 in the first direction D1 between the central line CT and the second sidewall SW2 of the third active portion 13.

A distance in the first direction D1 between the central line CT and the first sidewall SW1 of the first dummy portion 31 may be the same as a distance in the first direction D1 between the central line CT and the second sidewall SW2 of the first dummy portion 31. For example, a seventh minimum distance L7 in the first direction D1 between the central line CT and the first sidewall SW1 of the first dummy portion 31 may be the same as an eighth minimum distance L8 in the first direction D1 between the central line CT and the second sidewall SW2 of the first dummy portion 31.

The third and fourth minimum distances L3 and L4 may be greater than the first, second, seventh, and eighth minimum distances L1, L2, L7, and L8. The fifth and sixth minimum distances L5 and L6 may be greater than the third and fourth minimum distances L3 and L4.

A distance in the first direction D1 between the first sidewall SW1 of the first active portion 11 and the first sidewall SW1 of the second active portion 12 may be the same as a distance in the first direction D1 between the second sidewall SW2 of the first active portion 11 and the second sidewall SW2 of the second active portion 12. For example, a ninth minimum distance L9 in the first direction D1 between the first sidewall SW1 of the first active portion 11 and the first sidewall SW1 of the second active portion 12 may be the same as a tenth minimum distance L10 in the first direction D1 between the second sidewall SW2 of the first active portion 11 and the second sidewall SW2 of the second active portion 12.

A distance in the first direction D1 between the first sidewall SW1 of the second active portion 12 and the first sidewall SW1 of the third active portion 13 may be the same as a distance in the first direction D1 between the second sidewall SW2 of the second active portion 12 and the second sidewall SW2 of the third active portion 13. For example, an eleventh minimum distance L11 in the first direction D1 between the first sidewall SW1 of the second active portion 12 and the first sidewall SW1 of the third active portion 13 may be the same as a twelfth minimum distance L12 in the first direction D1 between the second sidewall SW2 of the second active portion 12 and the second sidewall SW2 of the third active portion 13.

A distance in the first direction D1 between the first sidewall SW1 of the third active portion 13 and the first sidewall SW1 of the first dummy portion 31 may be the same as a distance in the first direction D1 between the second sidewall SW2 of the third active portion 13 and the second sidewall SW2 of the first dummy portion 31. For example, a thirteenth minimum distance L13 in the first direction D1 between the first sidewall SW1 of the third active portion 13 and the first sidewall SW1 of the first dummy portion 31 may be the same as a fourteenth minimum distance L14 in the first direction D1 between the second sidewall SW2 of the third active portion 13 and the second sidewall SW2 of the first dummy portion 31.

The thirteenth and fourteenth minimum distances L13 and L14 may be greater than the ninth, tenth, eleventh, and twelfth minimum distances L9, L10, L11, and L12. For example, each of the thirteenth and fourteenth minimum distances L13 and L14 may be about twice each of the ninth, tenth, eleventh, and twelfth minimum distances L9, L10, L11, and L12. In some implementations, the ninth, tenth, eleventh, and twelfth minimum distances L9, L10, L11, and L12 may be greater than a thickness of the gate dielectric layer GI. In some implementations, the ninth, tenth, eleventh, and twelfth minimum distances L9, L10, L11, and L12 may be the same as each other.

None of the fourth, fifth, and sixth active portions 14, 15, and 16 and the second dummy portion 32 may each be symmetrically disposed.

A distance in the first direction D1 between the first sidewall SW1 of the fourth active portion 14 and the first sidewall SW1 of the fifth active portion 15 may be greater than the distance in the first direction D1 between the first sidewall SW1 of the first active portion 11 and the first sidewall SW1 of the second active portion 12. For example, a fifteenth minimum distance L15 in the first direction D1 between the first sidewall SW1 of the fourth active portion 14 and the first sidewall SW1 of the fifth active portion 15 may be about twice the ninth minimum distance L9.

A distance in the first direction D1 between the first sidewall SW1 of the fifth active portion 15 and the first sidewall SW1 of the sixth active portion 16 may be greater than the distance in the first direction D1 between the first sidewall SW1 of the second active portion 12 and the first sidewall SW1 of the third active portion 13. For example, a sixteenth minimum distance L16 in the first direction D1 between the first sidewall SW1 of the fifth active portion 15 and the first sidewall SW1 of the sixth active portion 16 may be about twice the eleventh minimum distance L11.

A distance in the first direction D1 between the first sidewall SW1 of the sixth active portion 16 and the first sidewall SW1 of the second dummy portion 32 may be greater than the distance in the first direction D1 between the first sidewall SW1 of the third active portion 13 and the first sidewall SW1 of the first dummy portion 31. For example, a seventeenth minimum distance L17 in the first direction D1 between the first sidewall SW1 of the sixth active portion 16 and the first sidewall SW1 of the second dummy portion 32 may be about twice the thirteenth minimum distance L13. In some implementations, the thirteenth, fifteenth, and sixteenth minimum distances L13, L15, and L16 may be the same as each other.

The first intervening portion 21 may have a first connection sidewall 21a that faces the second active pattern AP2 and a second connection sidewall 21b opposite to the first connection sidewall 21a. Similar to the first intervening portion 21, each of the second and third intervening portions 22 and 23 may have a first connection sidewall and a second connection sidewall. The fourth intervening portion 24 may have a first connection sidewall 24a that faces the first active pattern AP1 and a second connection sidewall 24b opposite to the first connection sidewall 24a. Similar to the fourth intervening portion 24, each of the fifth and sixth intervening portions 25 and 26 may have a first connection sidewall and a second connection sidewall. The first intervening portion 21 and the fourth intervening portion 24 may have their widths in the second direction D2 that are the same as each other. When viewed in plan, a length of the first connection sidewall 24a of the fourth intervening portion 24 may be greater than that of the first and second connection sidewalls 21a and 21b of the first intervening portion 21.

The second sidewalls SW2 of the fourth, fifth, and sixth active portions 14, 15, and 16 may be coplanar with the second sidewall SW2 of the second dummy portion 32 and the second connection sidewall 24b of the fourth intervening portion 24. The second sidewalls SW2 of the fourth, fifth, and sixth active portions 14, 15, and 16, the second sidewall SW2 of the second dummy portion 32, and the second connection sidewall 24b of the fourth intervening portion 24 may be disposed on one straight line that extends in the second direction D2. A distance in the first direction D1 between the second sidewalls SW2 of the fourth and fifth active portions 14 and 15 may be less than a thickness of the gate dielectric layer GI.

A distance between the first sidewall SW1 of the first active portion 11 and a power line adjacent to the second active pattern AP2 may be greater than a distance between the first sidewall SW1 of the second active portion 12 and a power line adjacent to the second active pattern AP2. A distance between the second sidewall SW2 of the first active portion 11 and a power line adjacent to the second active pattern AP2 may be less than a distance between the second sidewall SW2 of the second active portion 12 and a power line adjacent to the second active pattern AP2.

A distance between the first sidewall SW1 of the fourth active portion 14 and a power line adjacent to the first active pattern AP1 may be greater than a distance between the first sidewall SW1 of the fifth active portion 15 and a power line adjacent to the first active pattern AP1. A distance between the second sidewall SW2 of the fourth active portion 14 and a power line adjacent to the first active pattern AP1 may be the same as a distance between the second sidewall SW2 of the fifth active portion 15 and a power line adjacent to the first active pattern AP1.

The first, second, third, fourth, fifth, and sixth patterns SD1, SD2, SD3, SD4, SD5, and SD6 and the first and second dummy source/drain patterns DSD1 and DSD2 may have their widths that correspond to those of the first, second, third, fourth, fifth, and sixth active portions 11, 12, 13, 14, 15, and 16 and the first and second dummy portions 31 and 32.

A width in the first direction D1 of the first source/drain pattern SD1 may be less than a width in the first direction D1 of the second source/drain pattern SD2. For example, a first maximum width W9 in the first direction D1 of the first source/drain pattern SD1 may be less than a second maximum width W10 in the first direction D1 of the second source/drain pattern SD2.

The width in the first direction D1 of the second source/drain pattern SD2 may be less than a width in the first direction D1 of the third source/drain pattern SD3. For example, the second maximum width W10 may be less than a third maximum width W11 in the first direction D1 of the third source/drain pattern SD3.

The width in the first direction D1 of the third source/drain pattern SD3 may be greater than a width in the first direction D1 of the first dummy source/drain pattern DSD1. For example, the third maximum width W11 may be greater than a fourth maximum width W12 in the first direction D1 of the first dummy source/drain pattern DSD1.

A width in the first direction D1 of the fourth source/drain pattern SD4 may be less than a width in the first direction D1 of the fifth source/drain pattern SD5. For example, a fifth maximum width W13 in the first direction D1 of the fourth source/drain pattern SD4 may be less than a sixth maximum width W14 in the first direction D1 of the fifth source/drain pattern SD5.

A width in the first direction D1 of the fifth source/drain pattern SD5 may be less than a width in the first direction D1 of the sixth source/drain pattern SD6. For example, the sixth maximum width W14 may be less than a seventh maximum width W15 in the first direction D1 of the sixth source/drain pattern SD6.

A width in the first direction D1 of the sixth source/drain pattern SD6 may be greater than a width in the first direction D1 of the second dummy source/drain pattern DSD2. For example, the seventh maximum width W15 may be greater than an eighth maximum width W16 in the first direction D1 of the second dummy source/drain pattern DSD2.

The first, second, and third source/drain patterns SD1, SD2, and SD3 and the first dummy source/drain pattern DSD1 may have their centers that are disposed on one straight line that extends in the second direction D2. The first, second, and third source/drain patterns SD1, SD2, and SD3 and the first dummy source/drain pattern DSD1 may each be symmetrically disposed about one straight line that extends in the second direction D2.

The first, second, third, fourth, fifth, and sixth active contacts AC1, AC2, AC3, AC4, AC5, and AC6 may have their widths that correspond to those of the first, second, third, fourth, fifth, and sixth source/drain patterns SD1, SD2, SD3, SD4, SD5, and SD6.

A width W17 in the first direction D1 of the first active contact AC1 may be less than a width W18 in the first direction D1 of the second active contact AC2. The width W18 in the first direction D1 of the second active contact AC2 may be less than a width W19 in the first direction D1 of the third active contact AC3. A width W21 in the first direction D1 of the fourth active contact AC4 may be less than a width W22 in the first direction D1 of the fifth active contact AC5. The width W22 in the first direction D1 of the fifth active contact AC5 may be less than a width W23 in the first direction D1 of the sixth active contact AC6.

The first, second, third, fourth, fifth, and sixth channel patterns CH1, CH2, CH3, CH4, CH5, and CH6 may have their widths that correspond to those of the first, second, third, fourth, fifth, and sixth active portions 11, 12, 13, 14, 15, and 16. A width W25 in the first direction D1 of the first channel pattern CH1 may be less than a width W26 in the first direction D1 of the second channel pattern CH2. The width W26 in the first direction D1 of the second channel pattern CH2 may be less than a width W27 in the first direction D1 of the third channel pattern CH3. A width W29 in the first direction D1 of the fourth channel pattern CH4 may be less than a width W30 in the first direction D1 of the fifth channel pattern CH5. The width W30 in the first direction D1 of the fifth channel pattern CH5 may be less than a width W31 in the first direction D1 of the sixth channel pattern CH6.

In a semiconductor device according to some implementations, as the first, second, and third active portions 11, 12, and 13 are disposed to have their widths that sequentially increase, there may be a relatively small difference in width between the first and second active portions 11 and 12, a relatively small difference in width between the second and third active portions 12 and 13, and a relatively small length of the first and second connection sidewalls of the first and second intervening portions 21 and 22.

In a semiconductor device according to some implementations, as the first, second, and third active portions 11, 12, and 13 are each symmetrically disposed about the central line CT, the first and second intervening portions may each have first and second connection sidewalls having their relatively small lengths.

As each of the first and second intervening portions have the first and second connection sidewalls having their relatively small lengths, it may be possible to prevent or improve process defects due to the first and second connection sidewalls of each of the first and second intervening portions 21 and 22. For example, the gate electrode GE and a source/drain pattern (or a semiconductor pattern) may be improved or prevented from an electrical short caused by the creation of skirt in the gate electrode GE resulting from the first and second connection sidewalls of each of the first and second intervening portions 21 and 22.

In a semiconductor device according to some implementations, as the first dummy portion 31 having a relatively small width is disposed on the third active portion 13 having a relatively large width, the degree of freedom of design may be increased while compensating process defects caused by the third intervening portion 23.

Figure 5:
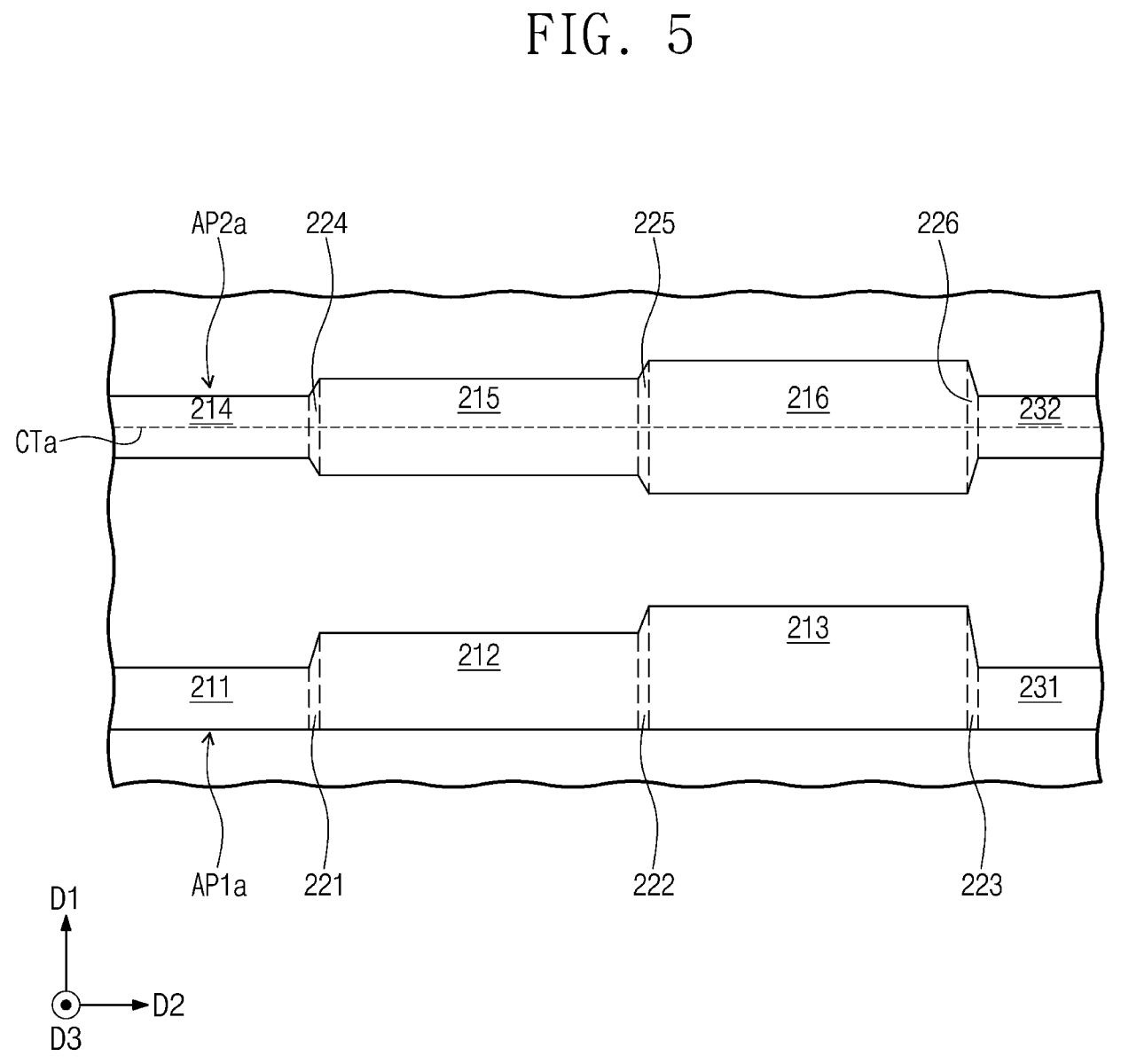

FIG. 5 illustrates an example plan view showing active patterns of a semiconductor pattern.

Referring to FIG. 5, a first active pattern AP1a may be an active pattern of a PMOSFET region, and a second active pattern AP2a may be an active pattern of an NMOSFET region.

The first active pattern AP1a may include a first active portion 211, a first intervening portion 221, a second active portion 212, a second intervening portion 222, a third active portion 213, a third intervening portion 223, and a first dummy portion 231 that are sequentially disposed along the second direction D2.

The second active pattern AP2a may include a fourth active portion 214, a fourth intervening portion 224, a fifth active portion 215, a fifth intervening portion 225, a sixth active portion 216, a sixth intervening portion 226, and a second dummy portion 232 that are sequentially disposed along the second direction D2.

The fourth, fifth, and sixth active portions 214, 215, and 216 of the second active portion AP2a may be disposed such that their widths are sequentially increased. The fourth, fifth, and sixth active portions 214, 215, and 216 and the second dummy portion 232 of the second active pattern AP2a may each be symmetrically disposed about a central line CTa of the second active pattern AP2a.

The first, second, and third active portions 211, 212, and 213 of the first active pattern AP1a may be disposed such that their widths are sequentially increased. The first, second, and third active portions 211, 212, and 213 and the first dummy portion 231 of the first dummy portion 231 of the first active pattern AP1a may not be symmetrically disposed.

Figure 6:
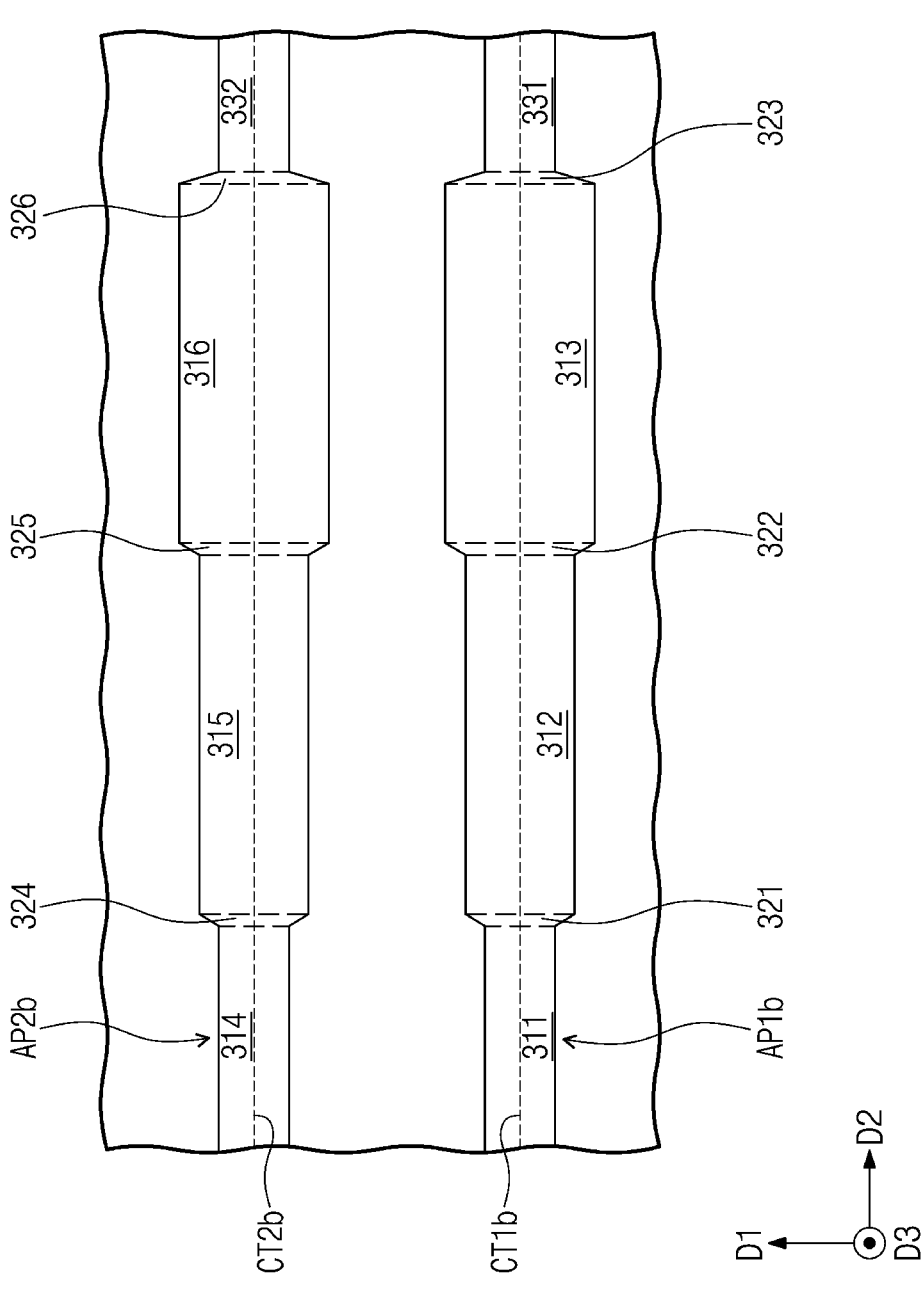
FIG. 6 illustrates another example plan view showing active patterns of a semiconductor device.

FIG. 6 illustrates another example plan view showing active patterns of a semiconductor device.

Referring to FIG. 6, a first active pattern AP1b may be an active pattern of a PMOSFET region, and the second active pattern AP2b may be an active pattern of an NMOSFET region.

The first active pattern AP1b may include a first active portion 311, a first intervening portion 321, a second active portion 312, a second intervening portion 322, a third active portion 313, a third intervening portion 323, and a first dummy portion 331 that are sequentially disposed along the second direction D2.

The second active pattern AP2b may include a fourth active portion 314, a fourth intervening portion 324, a fifth active portion 315, a fifth intervening portion 325, a sixth active portion 316, a sixth intervening portion 326, and a second dummy portion 332 that are sequentially disposed along the second direction D2.

The fourth, fifth, and sixth active portions 314, 315, and 316 of the second active pattern AP2b may be disposed such that their widths are sequentially increased. The fourth, fifth, and sixth active portions 314, 315, and 316 and the second dummy portion 332 of the second active pattern AP2b may each be symmetrically disposed about a central line CT2b of the second active pattern AP2b.

The first, second, and third active portions 311, 312, and 313 of the first active pattern AP1b may be disposed such that their widths are sequentially increased. The first, second, and third active portions 311, 312, and 313 and the first dummy portion 331 of the first active pattern AP1b may each be symmetrically disposed about a central line CT1b of the first active pattern AP1b.

Figure 7:
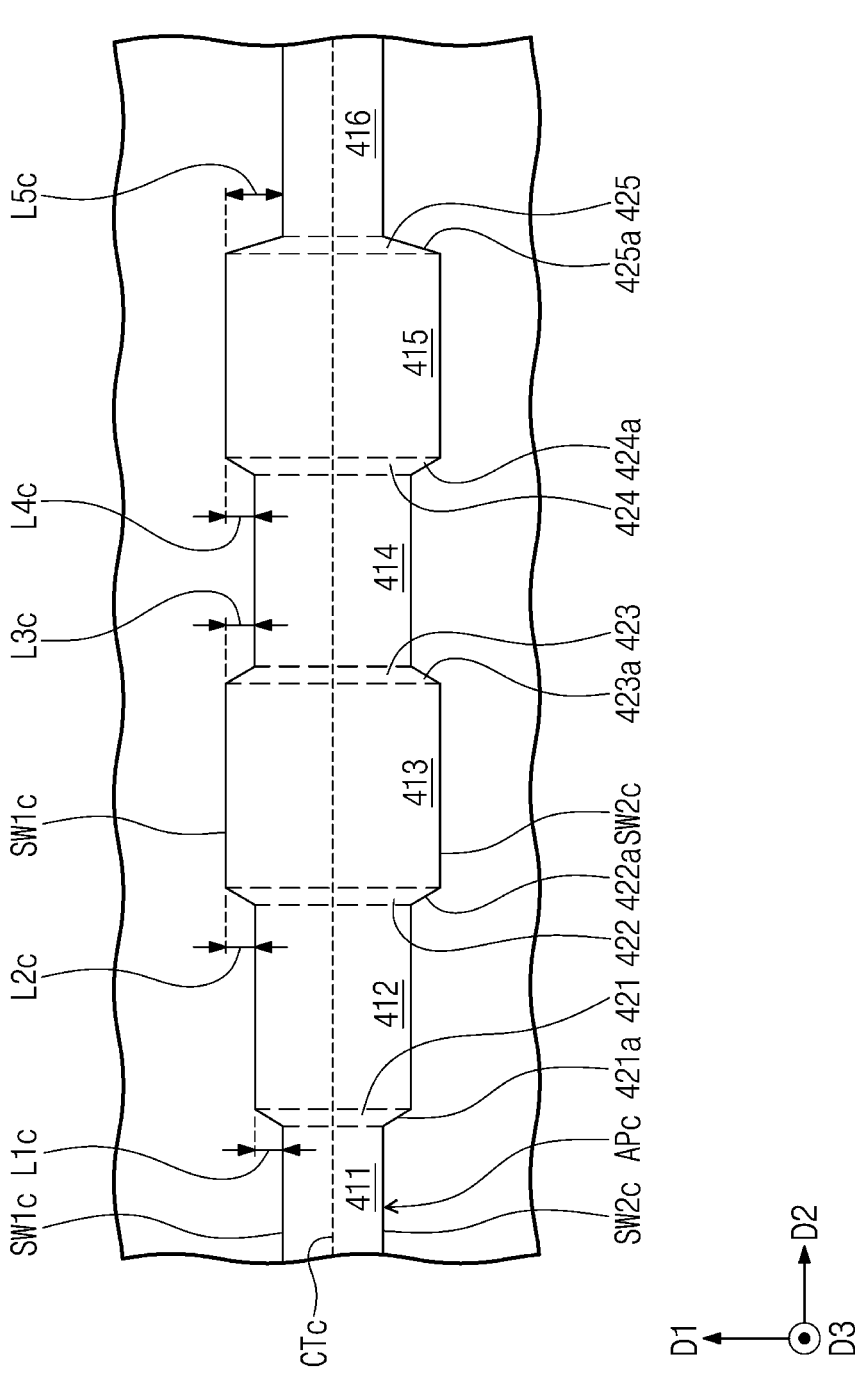
FIG. 7 illustrates another example plan view showing active patterns of a semiconductor device.

FIG. 7 illustrates another example plan view showing active patterns of a semiconductor device.

Referring to FIG. 7, an active pattern APc may include a first active portion 411, a first intervening portion 421, a second active portion 412, a second intervening portion 422, a third active portion 413, a third intervening portion 423, a fourth active portion 414, a fourth intervening portion 424, a fifth active portion 415, a fifth intervening portion 425, and a sixth active portion 416 that are sequentially disposed along the second direction D2.

The first, second, third, fourth, fifth, and sixth active portions 411, 412, 413, 414, 415, and 416 may each be symmetrically disposed about a central line CTc of the active pattern APc. Each of the first, second, third, fourth, fifth, and sixth active portions 411, 412, 413, 414, 415, and 416 may have a first sidewall SW1c and a second sidewall SW2c that are opposite to each other.

The first, second, third, fourth, and fifth active portions 411, 412, 413, 414, and 415 may be disposed such that there is a relatively small difference in width between two neighboring ones of the first, second, third, fourth, and fifth active portions 411, 412, 413, 414, and 415. A difference in width between the fifth and sixth active portions 415 and 416 may be greater than a difference in width between two neighboring ones of the first, second, third, fourth, and fifth active portions 411, 412, 413, 414, and 415. Each of minimum distances L1c, L2c, L3c, and L4c in the first direction D1 between first sidewalls SW1c of neighboring ones of the first, second, third, fourth, and fifth active portions 411, 412, 413, 414, and 415 may be less than a minimum distance L5c in the first direction D1 between first sidewalls SW1c of the fifth and sixth active portions 415 and 416.

Each of lengths of connection sidewalls 421a, 422a, 423a, and 424a included in the first, second, third, and fourth intervening portions 421, 422, 423, and 424 may be less than a length of a connection sidewall 415a of the fifth intervening portion 425.

In some implementations, the sixth active portion 416 may be a dummy portion.

Figure 8:
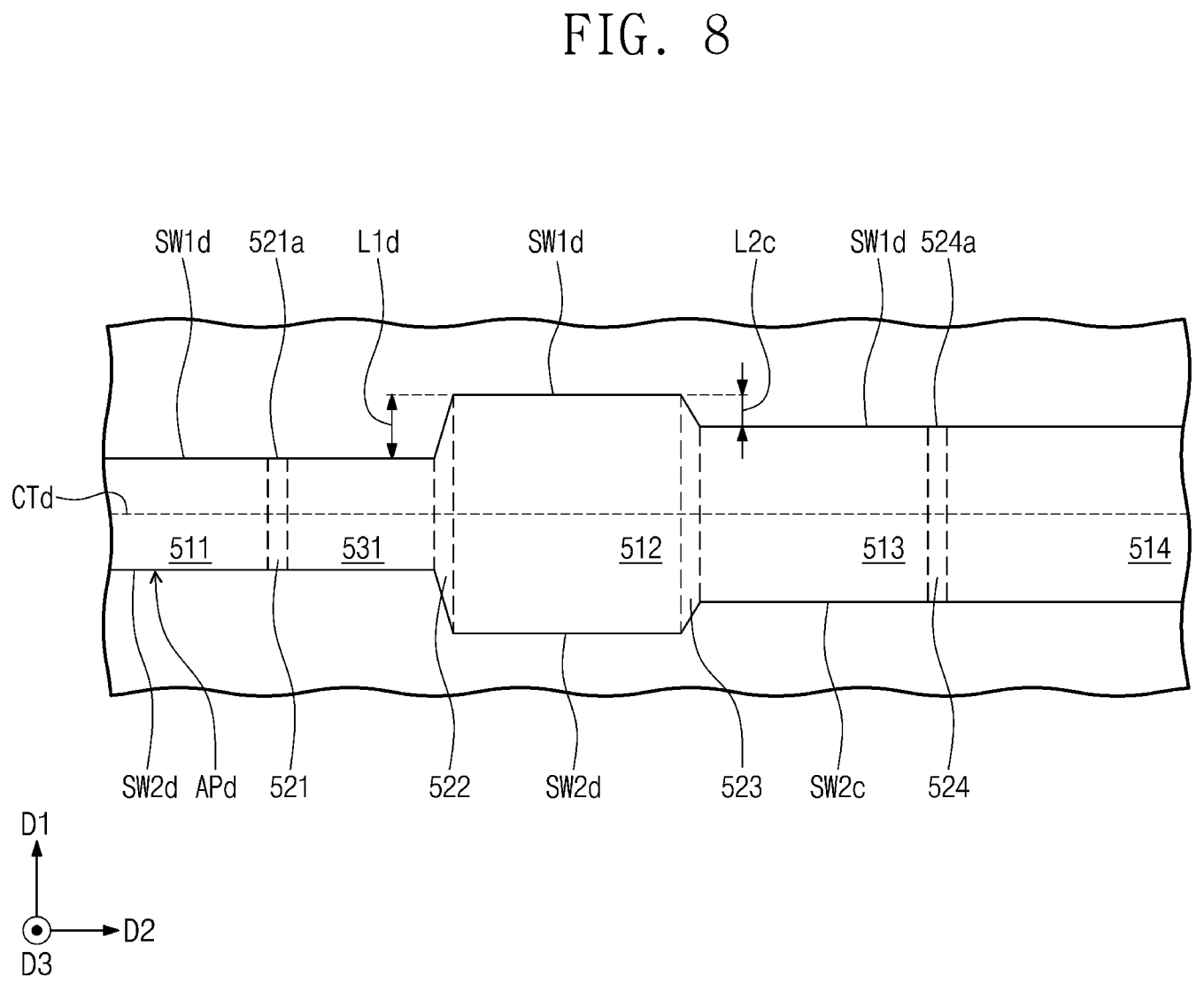

FIG. 8 illustrates another example plan view showing active patterns of a semiconductor device.

Referring to FIG. 8, an active pattern APd may include a first active portion 511, a first intervening portion 521, a dummy portion 531, a second intervening portion 522, a second active portion 512, a third intervening portion 523, a third active portion 513, a fourth intervening portion 524, and a fourth active portion 514 that are sequentially disposed along the second direction D2.

The first, second, third, and fourth active portions 511, 512, 513, and 514 and the dummy portion 531 may each be symmetrically disposed about a central line CTd of the active pattern APd. Each of the first, second, third, and fourth active portions 511, 512, 513, and 514 and the dummy portion 531 may have a first sidewall SW1d and a second sidewall SW2d that are opposite to each other.

The dummy portion 531 may be disposed between the first active portion 511 and the second active portion 512 between which a relatively large difference in width is provided. A minimum distance L1d in the first direction D1 between the first sidewall SW1d of the dummy portion 531 and the first sidewall SW1d of the second active portion 512 may be greater than a minimum distance L2d in the first direction D1 between the first sidewall SW1d of the second active portion 512 and the first sidewall SW1d of the third active portion 513.

A connection sidewall 521a of the first intervening portion 521 may be coplanar with the first sidewall SW1d of the first active portion 511 and the first sidewall SW1d of the dummy portion 531. A connection sidewall 524a of the fourth intervening portion 524 may be coplanar with the first sidewall SW1d of the third active portion 513 and the first sidewall SW1d of the fourth active portion 514.

In a semiconductor device, as active portions of an active pattern are disposed such that there is a minimum difference in width between neighboring active portions, it may be possible to minimize or prevent process defects caused by a structure between the active portions.

In a semiconductor device, as active portions of an active pattern are disposed such that their centers are aligned with each other, it may be possible to minimize or prevent process defects caused by a structure between the active portions.

While this specification contains many specific implementation details, these should not be construed as limitations on the scope of what may be claimed, but rather as descriptions of features that may be specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially be claimed as such, one or more features from a claimed combination can in some cases be excised from the combination, and the claimed combination may be directed to a subcombination or variation of a subcombination.

Although some implementations of the concepts described herein have been discussed with reference to accompanying figures, it will be understood that various changes in form and details may be made therein without departing from the spirit and scope of the technology described herein. It therefore will be understood that the implementations described above are just illustrative but not limitative in all aspects.

What is claimed is:

1. A semiconductor device, comprising:
a substrate that includes a first active pattern;
a first source/drain pattern, a second source/drain pattern, and a third source/drain pattern that are on the first active pattern;
a first separation structure between the first source/drain pattern and the second source/drain pattern; and
a second separation structure between the second source/drain pattern and the third source/drain pattern,
wherein the first active pattern includes:
a first active portion that overlaps the first source/drain pattern;
a second active portion that overlaps the second source/drain pattern;
a third active portion that overlaps the third source/drain pattern;
a first intervening portion between the first active portion and the second active portion; and
a second intervening portion between the second active portion and the third active portion,
wherein the first intervening portion overlaps the first separation structure,
wherein the second intervening portion overlaps the second separation structure,
wherein a first width of the first active portion is different from a second width of the second active portion,
wherein a third width of the third active portion is different from the second width, and wherein each of the first, second, and third active portions has a first sidewall and a second sidewall that are disposed symmetrically with respect to a central line of the first active pattern.

2. The semiconductor device of claim 1, wherein the first width is less than the second width, a first distance between the central line and the first sidewall of the first active portion is less than a second distance between the central line and the first sidewall of the second active portion, and a third distance between the central line and the second sidewall of the first active portion is less than a fourth distance between the central line and the second sidewall of the second active portion.

3. The semiconductor device of claim 2, wherein the third width is greater than the second width, a fifth distance between the central line and the first sidewall of the third active portion is greater than the third distance, and a sixth distance between the central line and the second sidewall of the third active portion is greater than the fourth distance.

4. The semiconductor device of claim 1, wherein a first distance between the first sidewall of the first active portion and the first sidewall of the second active portion is a same as a second distance between the first sidewall of the third active portion and the first sidewall of the second active portion.

5. The semiconductor device of claim 4, wherein a third distance between the second sidewall of the first active portion and the second sidewall of the second active portion is a same as a fourth distance between the second sidewall of the third active portion and the second sidewall of the second active portion.

6. The semiconductor device of claim 5, wherein the first distance, the second distance, the third distance, and the fourth distance are a same as each other.

7. The semiconductor device of claim 1, wherein a first maximum width of the first source/drain pattern is different from a second maximum width of the second source/drain pattern, and a third maximum width of the third source/drain pattern is different from the second maximum width.

8. The semiconductor device of claim 1, further comprising:

a first active contact connected to the first source/drain pattern;

a second active contact connected to the second source/drain pattern; and a third active contact connected to the third source/drain pattern, wherein a fourth width of the first active contact is different from a fifth width of the second active contact, and wherein a sixth width of the third active contact is different from the fifth width.

9. The semiconductor device of claim 8, wherein the first width is less than the second width, the second width is less than the third width, the fourth width is less than the fifth width, and the fifth width is less than the sixth width.

10. A semiconductor device, comprising:

a substrate that includes a first active pattern and a second active pattern; and a first separation structure and a second separation structure on the first active pattern and the second active pattern, wherein the first active pattern includes:

a first intervening portion that overlaps the first separation structure;

a second intervening portion that overlaps the second separation structure;

a first active portion connected to the first intervening portion;

a second active portion connected to the first intervening portion and the second intervening portion; and a third active portion connected to the second intervening portion, wherein a first width of the first active portion is different from a second width of the second active portion, wherein a third width of the third active portion is different from the second width, wherein each of the first, second, and third active portions has a first sidewall that faces the second active pattern, and wherein a first distance between the first sidewall of the first active portion and the first sidewall of the second active portion is a same as a second distance between the first sidewall of the second active portion and the first sidewall of the third active portion.

11. The semiconductor device of claim 10, wherein each of the first, second, and third active portions has a second sidewall opposite to the first sidewall, and the second sidewalls of the first, second, and third active portions are coplanar with each other.

12. The semiconductor device of claim 10, wherein each of the first, second, and third active portions has a second sidewall opposite to the first sidewall, and the first sidewall and the second sidewall of each of the first, second, and third active portions are disposed symmetrically with respect to a central line of the first active pattern.

13. The semiconductor device of claim 12, wherein the second active pattern includes:

a third intervening portion that overlaps the first separation structure;

a fourth intervening portion that overlaps the second separation structure;

a fourth active portion connected to the third intervening portion;

a fifth active portion connected to the third intervening portion and the fourth intervening portion; and a sixth active portion connected to the fourth intervening portion, wherein a fourth width of the fourth active portion is different from a fifth width of the fifth active portion, wherein a sixth width of the sixth active portion is different from the fifth width, and wherein each of the fourth, fifth, and sixth active portions has a first sidewall and a second sidewall that are disposed symmetrically with respect to a central line of the second active pattern.

14. The semiconductor device of claim 10, wherein the first active pattern further includes:

a third intervening portion connected to the third active portion; and a fourth active portion connected to the third intervening portion, wherein a fourth width of the fourth active portion is different from the third width, wherein the fourth active portion has a first sidewall that faces the second active pattern, and wherein a third distance between the first sidewall of the fourth active portion and the first sidewall of the third active portion is a same as the first distance and the second distance.

15. The semiconductor device of claim 10, wherein the first active pattern further includes:
a third intervening portion connected to the third active portion; and
a dummy portion connected to the third intervening portion,
wherein a fourth width of the dummy portion is different from the third width,
wherein the dummy portion has a first sidewall that faces the second active pattern, and
wherein a third distance between the first sidewall of the dummy portion and the first sidewall of the third active portion is greater than the first distance and the second distance.

16. The semiconductor device of claim 15, further comprising a dummy source/drain pattern that overlaps the dummy portion, and
wherein the dummy source/drain pattern is electrically floated.

17. The semiconductor device of claim 10, further comprising:
a gate electrode that intersects the first active pattern; and
a gate dielectric layer between the first active pattern and the gate electrode, and
wherein each of the first distance and the second distance is greater than a thickness of the gate dielectric layer.

18. The semiconductor device of claim 10, further comprising a power line adjacent to the second active pattern,
wherein each of the first, second, and third active portions has a second sidewall opposite to the first sidewall,
wherein a distance between the power line and the first sidewall of the first active portion is greater than a distance between the power line and the first sidewall of the second active portion, and
wherein a distance between the power line and the second sidewall of the first active portion is less than a distance between the power line and the second sidewall of the second active portion.

19. The semiconductor device of claim 18, wherein the distance between the power line and the first sidewall of the second active portion is greater than a distance between the power line and the first sidewall of the third active portion, and
the distance between the power line and the second sidewall of the second active portion is less than a distance between the power line and the second sidewall of the third active portion.

20. A semiconductor device, comprising:
a substrate that includes a first active pattern;
a first source/drain pattern, a second source/drain pattern, a third source/drain pattern, and a dummy source/drain pattern that are on the first active pattern;
a first separation structure between the first source/drain pattern and the second source/drain pattern;
a second separation structure between the second source/drain pattern and the third source/drain pattern; and
a third separation structure between the third source/drain pattern and the dummy source/drain pattern,
wherein the first active pattern includes:
a first active portion that overlaps the first source/drain pattern;
a second active portion that overlaps the second source/drain pattern;
a third active portion that overlaps the third source/drain pattern;
a dummy portion that overlaps the dummy source/drain pattern;
a first intervening portion between the first active portion and the second active portion;
a second intervening portion between the second active portion and the third active portion; and
a third intervening portion between the third active portion and the dummy portion,
wherein the first intervening portion overlaps the first separation structure,
wherein the second intervening portion overlaps the second separation structure,
wherein the third intervening portion overlaps the third separation structure,
wherein each of the first active portion, the second active portion, the third active portion, and the dummy portion has a first sidewall and a second sidewall that are disposed symmetrically with respect to a central line of the first active pattern, and
wherein each of (i) a first distance between the first sidewall of the first active portion and the first sidewall of the second active portion and (ii) a second distance between the first sidewall of the second active portion and the first sidewall of the third active portion is less than a third distance between the first sidewall of the third active portion and the first sidewall of the dummy portion.

\* \* \* \* \*